(12) United States Patent
van der Meulen

(10) Patent No.: US 10,086,511 B2
(45) Date of Patent: Oct. 2, 2018

(54) SEMICONDUCTOR MANUFACTURING SYSTEMS

(71) Applicant: Brooks Automation, Inc., Chelmsford, MA (US)

(72) Inventor: Peter van der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 256 days.

(21) Appl. No.: 14/014,910

(22) Filed: Aug. 30, 2013

(65) Prior Publication Data

US 2013/0343841 A1 Dec. 26, 2013

Related U.S. Application Data

(60) Continuation of application No. 13/248,386, filed on Sep. 29, 2011, now Pat. No. 8,523,507, which is a
(Continued)

(51) Int. Cl.
*H01L 21/67* (2006.01)
*B25J 9/04* (2006.01)
(Continued)

(52) U.S. Cl.
CPC .......... *B25J 9/042* (2013.01); *H01L 21/6719* (2013.01); *H01L 21/67126* (2013.01);
(Continued)

(58) Field of Classification Search
CPC ......... H01L 21/67184; H01L 21/67161; H01L 21/67167
See application file for complete search history.

(56) References Cited

U.S. PATENT DOCUMENTS 3,294,670 A 12/1966 Charschan et al.
3,310,227 A 3/1967 Norman
(Continued)

FOREIGN PATENT DOCUMENTS

DE 4333820 4/1994
EP 0506045 9/1992
(Continued)

OTHER PUBLICATIONS

Walsh, et al., "An Automated System for Loading Atomoscan Process Tubes Using Intrabay Material Handling Technologies", IEEE, (1992) 18 pages.
(Continued)

*Primary Examiner* — James W Keenan
(74) *Attorney, Agent, or Firm* — Perman & Green, LLP; Colin C. Durham

(57) ABSTRACT

Linear semiconductor handling systems provide more balanced processing capacity using various techniques to provide increased processing capacity to relatively slow processes. This may include use of hexagonal vacuum chambers to provide additional facets for slow process modules, use of circulating process modules to provide more processing capacity at a single facet of a vacuum chamber, or the use of wide process modules having multiple processing sites. This approach may be used, for example, to balance processing capacity in a typical process that includes plasma enhanced chemical vapor deposition steps and bevel etch steps.

21 Claims, 14 Drawing Sheets

Related U.S. Application Data division of application No. 12/239,717, filed on Sep. 26, 2008, now Pat. No. 8,029,226, which is a continuation-in-part of application No. 11/679,829, filed on Feb. 27, 2007, now abandoned, which is a continuation-in-part of application No. 10/985,834, filed on Nov. 10, 2004, now Pat. No. 7,458,763.

(60) Provisional application No. 60/777,443, filed on Feb. 27, 2006, provisional application No. 60/518,823, filed on Nov. 10, 2003, provisional application No. 60/607,649, filed on Sep. 7, 2004, provisional application No. 60/975,350, filed on Sep. 26, 2007.

(51) Int. Cl.
*H01L 21/677* (2006.01)
*H01L 21/68* (2006.01)
*H01L 21/687* (2006.01)

(52) U.S. Cl.
CPC .. *H01L 21/67161* (2013.01); *H01L 21/67167* (2013.01); *H01L 21/67173* (2013.01); *H01L 21/67178* (2013.01); *H01L 21/67184* (2013.01); *H01L 21/67196* (2013.01); *H01L 21/67201* (2013.01); *H01L 21/67207* (2013.01); *H01L 21/67253* (2013.01); *H01L 21/67259* (2013.01); *H01L 21/67727* (2013.01); *H01L 21/67733* (2013.01); *H01L 21/67736* (2013.01); *H01L 21/67742* (2013.01); *H01L 21/67745* (2013.01); *H01L 21/67748* (2013.01); *H01L 21/67754* (2013.01); *H01L 21/67757* (2013.01); *H01L 21/67781* (2013.01); *H01L 21/68* (2013.01); *H01L 21/68707* (2013.01); *H01L 21/68735* (2013.01); *Y10S 414/135* (2013.01); *Y10S 414/137* (2013.01)

(56) References Cited

U.S. PATENT DOCUMENTS

| | | |
|---|---|---|
| 3,521,765 A | 7/1970 | Kauffman et al. |
| 3,581,014 A | 5/1971 | Vogel et al. |
| 3,584,847 A | 6/1971 | Hammond et al. |
| 3,740,617 A | 6/1973 | Teramoto et al. |
| 3,796,163 A | 3/1974 | Meyer et al. |
| 3,834,555 A | 9/1974 | Bennington et al. |
| 3,874,525 A | 4/1975 | Hassan et al. |
| 3,925,182 A | 12/1975 | Carmichael et al. |
| 3,932,843 A | 1/1976 | Trelut et al. |
| 3,968,018 A | 7/1976 | Lane et al. |
| 4,015,558 A | 4/1977 | Small et al. |
| 4,184,448 A | 1/1980 | Aichert et al. |
| 4,275,978 A | 6/1981 | Brooks et al. |
| 4,299,533 A | 11/1981 | Ohnaka |
| 4,318,767 A | 3/1982 | Hijikata et al. |
| 4,392,776 A | 7/1983 | Shum |
| 4,398,720 A | 8/1983 | Jones et al. |
| 4,425,624 A | 1/1984 | Planche |
| 4,433,951 A | 2/1984 | Koch et al. |
| 4,529,460 A | 7/1985 | Hasegawa et al. |
| 4,584,045 A | 4/1986 | Richards |
| 4,632,624 A | 12/1986 | Mirkovich et al. |
| 4,664,578 A | 5/1987 | Kakehi |
| 4,666,366 A | 5/1987 | Davis |
| 4,682,927 A | 7/1987 | Southworth et al. |
| 4,701,096 A | 10/1987 | Fisher, Jr. |
| 4,702,668 A | 10/1987 | Carlisle et al. |
| 4,712,971 A | 12/1987 | Fyler |
| 4,722,298 A | 2/1988 | Rubin et al. |
| 4,724,322 A | 2/1988 | Knowles et al. |
| 4,727,993 A | 3/1988 | Mirkovich et al. |
| 4,730,976 A | 3/1988 | Davis et al. |
| 4,749,465 A | 6/1988 | Flint et al. |
| 4,763,276 A | 8/1988 | Perreirra et al. |
| 4,775,281 A | 10/1988 | Prentakis |
| 4,809,193 A | 2/1989 | Jourjine |
| 4,813,732 A | 3/1989 | Klem |
| 4,817,556 A | 4/1989 | Mears et al. |
| 4,819,167 A | 4/1989 | Cheng et al. |
| 4,825,808 A | 5/1989 | Takahashi et al. |
| 4,826,360 A | 5/1989 | Iwasawa et al. |
| 4,831,270 A | 5/1989 | Weisenberger |
| 4,836,233 A | 6/1989 | Milgate, III |
| 4,875,825 A | 10/1989 | Tullis et al. |
| 4,884,216 A | 11/1989 | Kuperstein |
| 4,909,701 A | 3/1990 | Hardegen et al. |
| 4,917,556 A | 4/1990 | Stark et al. |
| 4,951,601 A | 8/1990 | Maydan et al. |
| 5,013,210 A | 5/1991 | Bond |
| 5,019,233 A | 5/1991 | Blake et al. |
| 5,020,475 A | 6/1991 | Crabb et al. |
| 5,036,006 A | 7/1991 | Sanford et al. |
| 5,044,871 A | 9/1991 | Davis et al. |
| 5,058,526 A | 10/1991 | Matsushita et al. |
| 5,064,340 A * | 11/1991 | Genov .................. B25J 9/042 414/744.5 |
| 5,067,218 A | 11/1991 | Williams |
| 5,076,205 A | 12/1991 | Vowles et al. |
| 5,135,349 A | 8/1992 | Lorenz et al. |
| 5,180,275 A | 1/1993 | Czech et al. |
| 5,183,547 A | 2/1993 | Ikeda |
| 5,218,709 A | 6/1993 | Fijany et al. |
| 5,227,708 A | 7/1993 | Lowrance |
| 5,234,303 A | 8/1993 | Koyano |
| 5,256,204 A | 10/1993 | Wu |
| 5,259,881 A | 11/1993 | Edwards et al. |
| 5,280,983 A | 1/1994 | Maydan et al. |
| 5,286,296 A | 2/1994 | Sato et al. |
| 5,286,344 A | 2/1994 | Blalock et al. |
| 5,292,393 A | 3/1994 | Maydan et al. |
| 5,308,431 A | 5/1994 | Maher et al. |
| 5,314,541 A | 5/1994 | Saito et al. |
| 5,314,986 A | 5/1994 | Ooms et al. |
| 5,333,986 A | 8/1994 | Mizukami et al. |
| 5,340,261 A | 8/1994 | Oosawa et al. |
| 5,344,365 A | 9/1994 | Scott et al. |
| 5,344,542 A | 9/1994 | Maher et al. |
| 5,364,222 A | 11/1994 | Akimoto et al. |
| 5,367,612 A | 11/1994 | Bozich et al. |
| 5,372,471 A | 12/1994 | Wu |
| 5,377,425 A | 1/1995 | Kawakami et al. |
| 5,382,806 A | 1/1995 | Bacchi et al. |
| 5,391,035 A | 2/1995 | Krueger |
| 5,399,531 A | 3/1995 | Wu |
| 5,405,230 A | 4/1995 | Ono et al. |
| 5,417,537 A | 5/1995 | Miller |
| 5,426,720 A | 6/1995 | Bozich et al. |
| 5,426,865 A | 6/1995 | Ikeda et al. |
| 5,431,529 A | 7/1995 | Eastman et al. |
| 5,432,887 A | 7/1995 | Khaw |
| 5,433,020 A | 7/1995 | Leech, Jr. |
| 5,435,683 A | 7/1995 | Oosawa et al. |
| 5,439,547 A | 8/1995 | Kumagai |
| 5,442,730 A | 8/1995 | Bigus |
| 5,447,409 A | 9/1995 | Grunes et al. |
| 5,447,431 A | 9/1995 | Muka |
| 5,448,681 A | 9/1995 | Khan |
| 5,452,078 A | 9/1995 | Cheng |
| 5,467,833 A | 11/1995 | Crain |
| 5,474,410 A | 12/1995 | Ozawa et al. |
| 5,483,138 A | 1/1996 | Scmookler et al. |
| 5,486,080 A | 1/1996 | Sieradzki |
| 5,511,005 A | 4/1996 | Abbe et al. |
| 5,511,147 A | 4/1996 | Abdel-Malek |
| 5,524,176 A | 6/1996 | Narita et al. |
| 5,526,254 A | 6/1996 | Sato et al. |
| 5,534,761 A | 7/1996 | Crippa |
| 5,538,390 A | 7/1996 | Salzman |
| 5,539,975 A | 7/1996 | Kukuljan et al. |
| 5,546,179 A | 8/1996 | Cheng |

(56) References Cited

U.S. PATENT DOCUMENTS

| | | |
|---|---|---|
| 5,558,482 A | 9/1996 | Hiroki et al. |
| 5,562,800 A | 10/1996 | Kawamura et al. |
| 5,563,798 A | 10/1996 | Berken et al. |
| 5,566,275 A | 10/1996 | Kano |
| 5,571,325 A | 11/1996 | Ueyama et al. |
| 5,577,879 A | 11/1996 | Eastman et al. |
| 5,584,647 A * | 12/1996 | Uehara .............. B25J 9/042 414/744.5 |
| 5,586,585 A | 12/1996 | Bonora et al. |
| 5,606,646 A | 2/1997 | Khan et al. |
| 5,609,689 A | 3/1997 | Kato et al. |
| 5,636,960 A | 6/1997 | Hiroki et al. |
| 5,653,894 A | 8/1997 | Ibbotson et al. |
| 5,654,903 A | 8/1997 | Reitman et al. |
| 5,657,553 A | 8/1997 | Tarui et al. |
| 5,668,056 A | 9/1997 | Wu et al. |
| 5,668,452 A | 9/1997 | Villarreal et al. |
| 5,691,897 A | 11/1997 | Brown et al. |
| 5,695,564 A | 12/1997 | Imahashi |
| 5,700,127 A | 12/1997 | Harada et al. |
| 5,701,400 A | 12/1997 | Amado |
| 5,706,201 A | 1/1998 | Andrews |
| 5,717,832 A | 2/1998 | Steimle et al. |
| 5,720,590 A | 2/1998 | Hofmeister |
| 5,737,496 A | 4/1998 | Frye et al. |
| 5,740,062 A | 4/1998 | Berken et al. |
| 5,751,003 A | 5/1998 | Rose et al. |
| 5,765,982 A | 6/1998 | Martin et al. |
| 5,765,983 A | 6/1998 | Caveney et al. |
| 5,781,432 A | 7/1998 | Keeler et al. |
| 5,801,945 A | 9/1998 | Comer |
| 5,810,549 A | 9/1998 | Wytman |
| 5,814,733 A | 9/1998 | Khoury et al. |
| 5,820,679 A | 10/1998 | Yokoyama et al. |
| 5,882,165 A | 3/1999 | Maydan et al. |
| 5,882,171 A | 3/1999 | Tinner et al. |
| 5,882,413 A | 3/1999 | Beaulieu et al. |
| 5,888,048 A | 3/1999 | Martin et al. |
| 5,894,348 A | 4/1999 | Bacchi et al. |
| 5,894,760 A | 4/1999 | Caveney |
| 5,895,596 A | 4/1999 | Stoddard et al. |
| 5,897,710 A | 4/1999 | Sato et al. |
| 5,899,658 A | 5/1999 | Hofmeister |
| 5,900,105 A | 5/1999 | Toshima |
| 5,917,601 A | 6/1999 | Shimazaki et al. |
| 5,931,627 A | 8/1999 | Okada et al. |
| 5,943,659 A | 8/1999 | Giles et al. |
| 5,944,857 A | 8/1999 | Edwards et al. |
| 5,957,651 A | 9/1999 | Takebayashi et al. |
| 5,982,492 A | 9/1999 | Oppenheimer et al. |
| 5,971,584 A | 10/1999 | Iriuchijima et al. |
| 5,976,199 A | 11/1999 | Wu et al. |
| 5,980,194 A | 11/1999 | Freerks et al. |
| 5,980,195 A | 11/1999 | Miyashita |
| 5,989,346 A | 11/1999 | Hiroki |
| 5,997,589 A | 12/1999 | Tien |
| 6,002,840 A | 12/1999 | Hofmeister |
| 6,006,016 A | 12/1999 | Faigon et al. |
| 6,013,920 A | 1/2000 | Gordon et al. |
| 6,017,820 A | 1/2000 | Ting et al. |
| 6,042,623 A | 3/2000 | Edwards |
| 6,045,315 A | 4/2000 | Azumano et al. |
| 6,048,154 A | 4/2000 | Wytman |
| 6,048,162 A | 4/2000 | Molsehi |
| 6,053,686 A | 4/2000 | Kyogoku |
| 6,053,687 A | 4/2000 | Kirkpatrick et al. |
| 6,053,980 A | 4/2000 | Suda et al. |
| 6,059,507 A | 5/2000 | Adams |
| 6,062,798 A | 5/2000 | Muka |
| 6,066,210 A | 5/2000 | Yonemitsu et al. |
| 6,073,366 A | 6/2000 | Aswad |
| 6,073,828 A | 6/2000 | Ma et al. |
| 6,076,652 A | 6/2000 | Head, III |
| 6,079,927 A | 6/2000 | Muka |
| 6,079,928 A | 6/2000 | Theriault et al. |
| 6,082,950 A | 7/2000 | Altwood et al. |
| 6,103,055 A | 8/2000 | Maher et al. |
| 6,105,454 A * | 8/2000 | Bacchi .............. B25J 9/042 414/744.5 |
| 6,108,006 A | 8/2000 | Hoppe |
| 6,110,214 A | 8/2000 | Klimasauskas |
| 6,119,532 A | 9/2000 | Park et al. |
| 6,122,566 A | 9/2000 | Nguyen et al. |
| 6,122,724 A | 9/2000 | Kawasaki et al. |
| 6,125,551 A | 10/2000 | Bushong et al. |
| 6,126,380 A | 10/2000 | Hillman |
| 6,126,381 A | 10/2000 | Bacchi et al. |
| 6,128,016 A | 10/2000 | Coelho et al. |
| 6,132,165 A | 10/2000 | Carducci |
| 6,135,854 A | 10/2000 | Masumura et al. |
| 6,142,722 A | 11/2000 | Genov et al. |
| 6,146,077 A | 11/2000 | Shin et al. |
| 6,149,367 A | 11/2000 | Begin |
| 6,149,379 A | 11/2000 | Shin et al. |
| 6,155,131 A | 12/2000 | Suwa et al. |
| 6,155,768 A | 12/2000 | Bacchi et al. |
| 6,161,051 A | 12/2000 | Hafemann et al. |
| 6,166,509 A | 12/2000 | Wyka et al. |
| 6,167,322 A | 12/2000 | Holbrooks |
| 6,190,037 B1 | 2/2001 | Das et al. |
| 6,190,104 B1 | 2/2001 | Ikeda et al. |
| 6,198,074 B1 | 3/2001 | Savas |
| 6,203,268 B1 | 3/2001 | Miyashita |
| 6,215,498 B1 | 4/2001 | Filo et al. |
| 6,224,312 B1 | 5/2001 | Sundar |
| 6,227,793 B1 | 5/2001 | Knighten |
| 6,234,107 B1 | 5/2001 | Tanaka et al. |
| 6,235,634 B1 | 5/2001 | White et al. |
| 6,238,161 B1 | 5/2001 | Kirkpatrick et al. |
| 6,242,748 B1 | 6/2001 | Gallagher et al. |
| 6,246,972 B1 | 6/2001 | Klimasauskas |
| 6,249,712 B1 | 6/2001 | Boiquaye |
| 6,250,869 B1 | 6/2001 | Kroeker |
| 6,253,464 B1 | 7/2001 | Klebanoff et al. |
| 6,256,555 B1 | 7/2001 | Bacchi et al. |
| 6,257,045 B1 | 7/2001 | Hosokawa et al. |
| 6,257,827 B1 | 7/2001 | Hendrickson et al. |
| 6,260,144 B1 | 7/2001 | Pitchenik et al. |
| 6,264,748 B1 | 7/2001 | Kuriki et al. |
| 6,266,634 B1 | 7/2001 | Buchsbaum et al. |
| 6,267,546 B1 | 7/2001 | Oxyer et al. |
| 6,267,549 B1 | 7/2001 | Brown et al. |
| 6,269,351 B1 | 7/2001 | Black |
| 6,270,306 B1 | 8/2001 | Otwell et al. |
| 6,277,199 B1 | 8/2001 | Lei et al. |
| 6,281,651 B1 | 8/2001 | Haanpaa et al. |
| 6,282,459 B1 | 8/2001 | Ballantine et al. |
| 6,283,355 B1 | 9/2001 | Ma et al. |
| 6,286,230 B1 | 9/2001 | White et al. |
| 6,293,291 B1 | 9/2001 | Sperlich et al. |
| 6,293,749 B1 | 9/2001 | Raaijmakers et al. |
| 6,296,735 B1 | 10/2001 | Marxer et al. |
| 6,297,611 B1 * | 10/2001 | Todorov .............. B25J 9/042 318/567 |
| 6,299,404 B1 | 10/2001 | Muka et al. |
| 6,309,161 B1 | 10/2001 | Hofmeister |
| 6,312,525 B1 | 11/2001 | Bright et al. |
| 6,313,596 B1 | 11/2001 | Wyka et al. |
| 6,315,512 B1 | 11/2001 | Tabrizi et al. |
| 6,318,951 B1 | 11/2001 | Schmidt et al. |
| 6,338,626 B1 | 1/2002 | Saeki |
| 6,339,730 B1 | 1/2002 | Matsushima |
| 6,345,239 B1 | 2/2002 | Bowman-amuah |
| 6,360,144 B1 | 3/2002 | Bacchi et al. |
| 6,366,830 B2 | 4/2002 | Bacchi et al. |
| 6,374,144 B1 | 4/2002 | Viviani et al. |
| 6,375,746 B1 | 4/2002 | Stevens et al. |
| 6,379,095 B1 | 4/2002 | Elliott et al. |
| 6,382,895 B1 | 5/2002 | Konishi et al. |
| 6,390,767 B1 | 5/2002 | Alper et al. |
| 6,393,337 B1 | 5/2002 | Perlov et al. |
| 6,396,232 B2 | 5/2002 | Haanpaa et al. |
| 6,396,516 B1 | 5/2002 | Beatty |
| 6,400,115 B1 | 6/2002 | Yamazoe |

(56) References Cited

U.S. PATENT DOCUMENTS

| | | |
|---|---|---|
| 6,405,101 B1 | 6/2002 | Johanson et al. |
| 6,415,193 B1 | 7/2002 | Betawar et al. |
| 6,425,722 B1 | 7/2002 | Ueda et al. |
| 6,439,824 B1 | 8/2002 | Harris et al. |
| 6,440,178 B2 | 8/2002 | Berner et al. |
| 6,440,261 B1 | 8/2002 | Tepman et al. |
| 6,443,686 B1 | 9/2002 | Wiesler et al. |
| 6,446,055 B1 | 9/2002 | Grand |
| 6,450,750 B1 | 9/2002 | Heyder et al. |
| 6,453,214 B1 | 9/2002 | Bacchi et al. |
| 6,456,894 B1 | 9/2002 | Nulman |
| 6,460,550 B2 | 10/2002 | Nguyen |
| 6,467,605 B1 | 10/2002 | Head, III |
| 6,471,422 B1 | 10/2002 | Ueda et al. |
| 6,477,685 B1 | 11/2002 | Lovelace |
| 6,481,956 B1 | 11/2002 | Hofmeister |
| 6,485,250 B2 | 11/2002 | Hofmeister |
| 6,486,444 B1 | 11/2002 | Fairbairn et al. |
| 6,494,666 B2 | 12/2002 | Wu et al. |
| 6,494,670 B2 | 12/2002 | Kroeker |
| 6,500,996 B1 | 12/2002 | Brown et al. |
| 6,501,070 B1 | 12/2002 | Bacchi et al. |
| 6,502,054 B1 | 12/2002 | Mooring et al. |
| 6,503,365 B1 | 1/2003 | Kim et al. |
| 6,506,009 B1 | 1/2003 | Nulman et al. |
| 6,514,032 B1 | 2/2003 | Saino et al. |
| 6,516,244 B1 | 2/2003 | Yoo et al. |
| 6,517,304 B1 | 2/2003 | Matsumoto |
| 6,519,504 B1 | 2/2003 | Soraoka et al. |
| 6,522,942 B2 | 2/2003 | Kondo et al. |
| 6,524,051 B2 | 2/2003 | Nering |
| 6,530,365 B2 | 3/2003 | Vanmoor |
| 6,530,732 B1 | 3/2003 | Theriault et al. |
| 6,533,530 B1 | 3/2003 | Zenpo |
| 6,540,869 B2 | 4/2003 | Saeki et al. |
| 6,547,510 B1 | 4/2003 | Beaulieu |
| 6,549,825 B2 | 4/2003 | Kurata |
| 6,558,509 B2 | 5/2003 | Kraus et al. |
| 6,575,177 B1 | 6/2003 | Brown et al. |
| 6,575,689 B2 | 6/2003 | Harris et al. |
| 6,581,048 B1 | 6/2003 | Werbos |
| 6,584,369 B2 | 6/2003 | Patel et al. |
| 6,584,416 B2 | 6/2003 | Morford |
| 6,585,828 B1 | 7/2003 | Kurita et al. |
| 6,586,336 B2 | 7/2003 | Jeong |
| 6,592,673 B2 | 7/2003 | Welch et al. |
| 6,601,888 B2 | 8/2003 | Mcilwraith et al. |
| 6,609,876 B2 | 8/2003 | Mages et al. |
| 6,618,645 B2 | 9/2003 | Bacchi et al. |
| 6,621,509 B1 | 9/2003 | Eiref et al. |
| 6,632,065 B1 | 10/2003 | Cameron et al. |
| 6,637,998 B2 | 10/2003 | Langan et al. |
| 6,640,151 B1 | 10/2003 | Somekh et al. |
| 6,641,328 B1 | 11/2003 | Smith et al. |
| 6,641,348 B1 | 11/2003 | Schultz et al. |
| 6,641,746 B2 | 11/2003 | Houge et al. |
| 6,643,563 B2 | 11/2003 | Hosek et al. |
| 6,663,333 B2 | 12/2003 | Kinnard et al. |
| 6,669,434 B2 | 12/2003 | Namba et al. |
| 6,678,572 B1 | 1/2004 | Oh |
| 6,684,127 B2 | 1/2004 | Fujita et al. |
| 6,694,224 B2 | 2/2004 | Ramanan |
| 6,697,517 B1 | 2/2004 | Hunter |
| 6,705,816 B2 | 3/2004 | Nguyen et al. |
| 6,719,516 B2 | 4/2004 | Kroeker |
| 6,719,517 B2 | 4/2004 | Beaulieu et al. |
| 6,723,172 B2 | 4/2004 | Mayes |
| 6,729,824 B2 | 5/2004 | Lei et al. |
| 6,735,482 B1 | 5/2004 | Erten et al. |
| 6,736,582 B1 | 5/2004 | Mages et al. |
| 6,738,682 B1 | 5/2004 | Pasadyn |
| 6,742,977 B1 | 6/2004 | Okayama et al. |
| 6,742,980 B2 | 6/2004 | Saski |
| 6,744,228 B1 | 6/2004 | Cahill et al. |
| 6,758,113 B2 | 7/2004 | Choy et al. |
| 6,760,796 B1 | 7/2004 | Rossmann et al. |
| 6,761,085 B1 | 7/2004 | Tan |
| 6,765,222 B2 | 7/2004 | Bacchi et al. |
| 6,767,170 B2 | 7/2004 | Kostler et al. |
| 6,779,962 B2 | 8/2004 | Poole |
| 6,784,418 B2 | 8/2004 | Bacchi et al. |
| 6,796,400 B2 | 9/2004 | Ito et al. |
| 6,802,934 B2 | 10/2004 | Saeki et al. |
| 6,813,543 B2 | 11/2004 | Aalund et al. |
| 6,815,661 B2 | 11/2004 | Bacchi et al. |
| 6,822,413 B2 | 11/2004 | Simondet |
| 6,827,788 B2 | 12/2004 | Takahashi |
| 6,837,663 B2 | 1/2005 | Mages et al. |
| 6,840,732 B2 | 1/2005 | Minami et al. |
| 6,841,006 B2 | 1/2005 | Barnes et al. |
| 6,841,485 B1 | 1/2005 | Inoue et al. |
| 6,845,292 B2 | 1/2005 | Sha et al. |
| 6,852,194 B2 | 2/2005 | Matsushita et al. |
| 6,853,920 B2 | 2/2005 | Hsiung et al. |
| 6,856,858 B2 | 2/2005 | Kurita |
| 6,863,485 B2 | 3/2005 | Mizokawa et al. |
| 6,869,263 B2 | 3/2005 | Gilchrist |
| 6,877,946 B2 | 4/2005 | Kinnard et al. |
| 6,883,776 B2 | 4/2005 | Aggarwal et al. |
| 6,889,447 B2 | 5/2005 | Lee et al. |
| 6,898,487 B2 | 5/2005 | Bacchi et al. |
| 6,900,459 B2 | 5/2005 | Farnworth et al. |
| 6,900,877 B2 | 5/2005 | Raaijmakers |
| 6,913,243 B1 | 7/2005 | Tomasch |
| 6,918,731 B2 | 7/2005 | Talmer |
| 6,924,463 B2 | 8/2005 | Donald et al. |
| 6,932,558 B2 | 8/2005 | Wu |
| 6,934,606 B1 | 8/2005 | Genetti et al. |
| 6,941,199 B1 | 9/2005 | Bottomley et al. |
| 6,944,584 B1 | 9/2005 | Tenney et al. |
| 6,949,143 B1 | 9/2005 | Kurita et al. |
| 6,949,844 B2 | 9/2005 | Cahill et al. |
| 6,950,716 B2 | 9/2005 | Ward et al. |
| 6,952,656 B1 | 10/2005 | Cordova et al. |
| 6,952,688 B1 | 10/2005 | Goldman et al. |
| 6,954,711 B2 | 10/2005 | Beinglass et al. |
| 6,959,225 B1 | 10/2005 | Logsdon et al. |
| 6,960,057 B1 | 11/2005 | Hofmeister |
| 6,962,644 B2 | 11/2005 | Paterson et al. |
| 6,969,227 B2 | 11/2005 | Kinnard et al. |
| 6,976,400 B1 | 12/2005 | Tan |
| 6,979,165 B2 | 12/2005 | Larson et al. |
| 6,979,168 B2 | 12/2005 | Uchimaki et al. |
| 6,985,779 B2 | 1/2006 | Hsiung et al. |
| 6,990,430 B2 | 1/2006 | Hosek |
| 6,996,456 B2 | 2/2006 | Cordell et al. |
| 7,025,554 B2 | 4/2006 | Ozawa et al. |
| 7,031,778 B2 | 4/2006 | Hsiung et al. |
| 7,032,614 B2 | 4/2006 | Lappen et al. |
| 7,047,093 B2 | 5/2006 | Nakamoto et al. |
| 7,047,099 B2 | 5/2006 | Shanmugasundram et al. |
| 7,102,124 B2 | 9/2006 | Bacchi et al. |
| 7,194,396 B2 | 3/2007 | Watanabe et al. |
| 7,198,448 B2 | 4/2007 | Ozawa et al. |
| 7,207,766 B2 | 4/2007 | Kurita et al. |
| 7,210,246 B2 | 5/2007 | van der Meulen |
| 7,230,441 B2 | 6/2007 | Carlson-stevermer |
| 7,245,989 B2 | 7/2007 | Hosek et al. |
| 7,283,255 B2 | 10/2007 | Ramsey et al. |
| 7,293,950 B2 | 11/2007 | Bonora et al. |
| 7,299,104 B2 | 11/2007 | Tezuka et al. |
| 7,316,748 B2 | 1/2008 | Li et al. |
| 7,331,751 B2 | 2/2008 | Tamura |
| 7,337,019 B2 | 2/2008 | Reiss et al. |
| 7,359,759 B2 | 4/2008 | Cheng et al. |
| 7,373,220 B2 | 5/2008 | Watanabe et al. |
| 7,376,472 B2 | 5/2008 | Wojsznis et al. |
| 7,383,751 B2 * | 6/2008 | Hashimoto ............ B25J 9/042 414/744.6 |
| 7,387,484 B2 | 6/2008 | Ho et al. |
| 7,398,259 B2 | 7/2008 | Nugent |
| 7,419,346 B2 | 9/2008 | Danna et al. |
| 7,422,406 B2 | 9/2008 | van der Meulen |
| 7,441,219 B2 | 10/2008 | Perry et al. |

(56) References Cited

U.S. PATENT DOCUMENTS

| | | |
|---|---|---|
| 7,458,763 B2 | 12/2008 | van der Meulen |
| 7,461,040 B1 | 12/2008 | Goldman et al. |
| 7,467,916 B2 | 12/2008 | Yamagishi et al. |
| 7,575,406 B2 | 8/2009 | Hofmeister et al. |
| 7,607,879 B2 | 10/2009 | Hall et al. |
| 7,619,094 B2 | 11/2009 | Chen et al. |
| 7,622,006 B2 | 11/2009 | Ishizawa et al. |
| 7,655,092 B2 | 2/2010 | Fairbairn et al. |
| 7,665,951 B2 | 2/2010 | Kurita et al. |
| 7,748,944 B2 | 7/2010 | Price et al. |
| 7,769,482 B2 | 8/2010 | Pannese et al. |
| 7,792,350 B2 | 9/2010 | Kiley et al. |
| 7,792,608 B2 | 9/2010 | Rice et al. |
| 7,815,739 B2 | 10/2010 | Matsuura |
| 7,841,820 B2 | 11/2010 | Bonora et al. |
| 7,874,781 B2 | 1/2011 | Nozawa et al. |
| 7,905,960 B2 | 3/2011 | Choi et al. |
| 7,959,395 B2 | 6/2011 | Hofmeister et al. |
| 8,398,355 B2 | 3/2013 | Holtkamp et al. |
| 8,562,271 B2* | 10/2013 | Hofmeister ......... H01L 21/6719 414/217 |
| 8,771,804 B2* | 7/2014 | Dordi ................ H01L 21/0206 427/532 |
| 9,248,568 B2* | 2/2016 | Caveney ................ B25J 9/042 |
| 9,325,228 B2* | 4/2016 | Hudgens ................ B25J 9/042 |
| 2001/0002358 A1 | 5/2001 | Hempel et al. |
| 2001/0014269 A1 | 8/2001 | Hartlage et al. |
| 2001/0020199 A1 | 9/2001 | Bacchi et al. |
| 2001/0038783 A1 | 11/2001 | Nakashima et al. |
| 2001/0041120 A1 | 11/2001 | Hofmeister |
| 2001/0048867 A1 | 12/2001 | Lebar et al. |
| 2001/0053324 A1 | 12/2001 | Saeki et al. |
| 2002/0002422 A1 | 1/2002 | Kondo et al. |
| 2002/0005168 A1 | 1/2002 | Kraus et al. |
| 2002/0006323 A1 | 1/2002 | Yoshida et al. |
| 2002/0021959 A1 | 2/2002 | Schauer et al. |
| 2002/0043274 A1 | 4/2002 | Mayes |
| 2002/0048506 A1 | 4/2002 | Babbs et al. |
| 2002/0055084 A1 | 5/2002 | Fischer et al. |
| 2002/0068992 A1 | 6/2002 | Hine et al. |
| 2002/0094265 A1 | 7/2002 | Momoki |
| 2002/0103571 A1 | 8/2002 | Yoo et al. |
| 2002/0111811 A1 | 8/2002 | Bares et al. |
| 2002/0131848 A1 | 9/2002 | Kurata |
| 2002/0138175 A1 | 9/2002 | Fugita et al. |
| 2002/0147534 A1 | 10/2002 | Delcheccolo et al. |
| 2002/0165636 A1 | 11/2002 | Hasan |
| 2002/0192056 A1 | 12/2002 | Reimer et al. |
| 2002/0192059 A1 | 12/2002 | Foster et al. |
| 2003/0012624 A1 | 1/2003 | Kinnard et al. |
| 2003/0053893 A1 | 3/2003 | Matsunaga et al. |
| 2003/0060922 A1 | 3/2003 | Schauer et al. |
| 2003/0063965 A1 | 4/2003 | Langan et al. |
| 2003/0077150 A1 | 4/2003 | Matsuda et al. |
| 2003/0082466 A1 | 5/2003 | del Puerto et al. |
| 2003/0083776 A1 | 5/2003 | Schauer et al. |
| 2003/0088530 A1 | 5/2003 | Ramanan |
| 2003/0129045 A1 | 7/2003 | Bonora et al. |
| 2003/0130761 A1 | 7/2003 | Schauer |
| 2003/0131458 A1 | 7/2003 | Wang et al. |
| 2003/0167102 A1 | 9/2003 | Johnson et al. |
| 2003/0168173 A1 | 9/2003 | Tamura |
| 2003/0171972 A1 | 9/2003 | Heskin |
| 2003/0173512 A1 | 9/2003 | Bacchi et al. |
| 2003/0176940 A1 | 9/2003 | Rangachari et al. |
| 2003/0035705 A1 | 12/2003 | Johnson |
| 2004/0013497 A1 | 1/2004 | Shirai |
| 2004/0020601 A1* | 2/2004 | Zhao ................ H01L 21/02126 156/345.32 |
| 2004/0052632 A1 | 3/2004 | Kinnard et al. |
| 2004/0055537 A1 | 3/2004 | Kurita et al. |
| 2004/0062627 A1 | 4/2004 | Aggarwal et al. |
| 2004/0067127 A1 | 4/2004 | Hofmeister et al. |
| 2004/0069225 A1 | 4/2004 | Fairbairn et al. |
| 2004/0076505 A1 | 4/2004 | Kinnard et al. |
| 2004/0091343 A1 | 5/2004 | Astegno et al. |
| 2004/0107766 A1 | 6/2004 | Bonne et al. |
| 2004/0151562 A1 | 8/2004 | Hofmeister et al. |
| 2004/0151574 A1 | 8/2004 | Lu |
| 2004/0175946 A1 | 9/2004 | Mayes |
| 2004/0179933 A1 | 9/2004 | Huang et al. |
| 2004/0206307 A1* | 10/2004 | Boroson ........... H01L 21/67184 118/719 |
| 2004/0221871 A1 | 11/2004 | Fletcher et al. |
| 2004/0238122 A1* | 12/2004 | Ishizawa ........... H01L 21/67109 156/345.31 |
| 2004/0240971 A1 | 12/2004 | Tezuka et al. |
| 2004/0261944 A1 | 12/2004 | Wakabayashi et al. |
| 2005/0095087 A1 | 5/2005 | Sullivan et al. |
| 2005/0105991 A1 | 5/2005 | Hofmeister et al. |
| 2005/0111938 A1 | 5/2005 | van der Meulen |
| 2005/0113964 A1 | 5/2005 | van der Meulen |
| 2005/0113976 A1 | 5/2005 | van der Meulen |
| 2005/0118000 A1 | 6/2005 | Kasai et al. |
| 2005/0118009 A1 | 6/2005 | van der Meulen |
| 2005/0120578 A1 | 6/2005 | van der Meulen |
| 2005/0194096 A1 | 9/2005 | Price et al. |
| 2005/0203664 A1 | 9/2005 | Schauer et al. |
| 2005/0222933 A1 | 10/2005 | Wesby |
| 2005/0223837 A1 | 10/2005 | van der Meulen |
| 2005/0286993 A1 | 12/2005 | Minami et al. |
| 2006/0016720 A1 | 1/2006 | Naito |
| 2006/0099063 A1 | 5/2006 | Pietrantonio et al. |
| 2006/0156979 A1 | 7/2006 | Thakur et al. |
| 2006/0177288 A1 | 8/2006 | Parker et al. |
| 2006/0241813 A1 | 10/2006 | Babu et al. |
| 2006/0246683 A1 | 11/2006 | Pan et al. |
| 2006/0250401 A1 | 11/2006 | Pannese et al. |
| 2006/0263177 A1 | 11/2006 | van der Meulen |
| 2006/0279573 A1 | 12/2006 | Pannese et al. |
| 2006/0279574 A1 | 12/2006 | Pannese et al. |
| 2006/0279575 A1 | 12/2006 | Pannese et al. |
| 2006/0279576 A1 | 12/2006 | Pannese et al. |
| 2007/0017445 A1* | 1/2007 | Takehara ........... H01L 21/67184 118/719 |
| 2007/0067678 A1 | 3/2007 | Hosek et al. |
| 2007/0071581 A1 | 3/2007 | Gilchrist et al. |
| 2007/0073430 A1 | 3/2007 | Govind et al. |
| 2007/0093430 A1 | 4/2007 | Chen et al. |
| 2007/0135932 A1 | 6/2007 | Pannese |
| 2007/0135933 A1 | 6/2007 | Pannese et al. |
| 2007/0141748 A1 | 6/2007 | Rice |
| 2007/0147979 A1 | 6/2007 | Rice et al. |
| 2007/0160447 A1 | 7/2007 | Amikura et al. |
| 2007/0264106 A1 | 11/2007 | van der Meulen |
| 2007/0269297 A1 | 11/2007 | van der Meulen et al. |
| 2007/0282480 A1 | 12/2007 | Pannese et al. |
| 2007/0285673 A1 | 12/2007 | Kiley et al. |
| 2007/0286710 A1 | 12/2007 | van der Meulen et al. |
| 2008/0014055 A1 | 1/2008 | van der Meulen |
| 2008/0085173 A1 | 4/2008 | van der Meulen |
| 2008/0124193 A1 | 5/2008 | van der Meulen et al. |
| 2008/0124194 A1 | 5/2008 | van der Meulen et al. |
| 2008/0124195 A1 | 5/2008 | van der Meulen et al. |
| 2008/0124196 A1 | 5/2008 | van der Meulen et al. |
| 2008/0124197 A1 | 5/2008 | van der Meulen et al. |
| 2008/0131237 A1 | 6/2008 | van der Meulen |
| 2008/0131238 A1 | 6/2008 | van der Meulen |
| 2008/0134075 A1 | 6/2008 | Pannese et al. |
| 2008/0134076 A1 | 6/2008 | Pannese et al. |
| 2008/0135788 A1 | 6/2008 | Fogel |
| 2008/0138175 A1 | 6/2008 | Mitchell et al. |
| 2008/0138178 A1 | 6/2008 | Ferrara et al. |
| 2008/0145192 A1 | 6/2008 | van de Meulen et al. |
| 2008/0145194 A1 | 6/2008 | Kiley et al. |
| 2008/0147333 A1 | 6/2008 | van der Meulen et al. |
| 2008/0147580 A1 | 6/2008 | Pannese |
| 2008/0155442 A1 | 6/2008 | Pannese et al. |
| 2008/0155443 A1 | 6/2008 | Pannese et al. |
| 2008/0155444 A1 | 6/2008 | Pannese et al. |
| 2008/0155445 A1 | 6/2008 | Pannese et al. |
| 2008/0155446 A1 | 6/2008 | Pannese et al. |
| 2008/0155447 A1 | 6/2008 | Pannese et al. |
| 2008/0155448 A1 | 6/2008 | Pannese et al. |

(56) References Cited

U.S. PATENT DOCUMENTS

| | | |
|---|---|---|
| 2008/0155449 A1 | 6/2008 | Pannese et al. |
| 2008/0155450 A1 | 6/2008 | Pannese et al. |
| 2008/0163094 A1 | 7/2008 | Pannese et al. |
| 2008/0163095 A1 | 7/2008 | Pannese et al. |
| 2008/0163096 A1 | 7/2008 | Pannese et al. |
| 2008/0167890 A1 | 7/2008 | Pannese et al. |
| 2008/0175694 A1 | 7/2008 | Park et al. |
| 2008/0187417 A1 | 8/2008 | van de Meulen et al. |
| 2008/0187418 A1 | 8/2008 | van de Meulen et al. |
| 2008/0208372 A1 | 8/2008 | Pannese |
| 2008/0219806 A1 | 9/2008 | van der Meulen et al. |
| 2008/0219807 A1 | 9/2008 | van der Meulen et al. |
| 2008/0219808 A1 | 9/2008 | van der Meulen et al. |
| 2008/0219809 A1 | 9/2008 | van der Meulen et al. |
| 2008/0219810 A1 | 9/2008 | van der Meulen et al. |
| 2008/0219811 A1 | 9/2008 | van der Meulen et al. |
| 2008/0219812 A1 | 9/2008 | van der Meulen et al. |
| 2008/0226429 A1 | 9/2008 | van der Meulen et al. |
| 2008/0231866 A1 | 9/2008 | Fogel |
| 2008/0232933 A1 | 9/2008 | Kiley |
| 2008/0232947 A1 | 9/2008 | van der Meulen et al. |
| 2008/0232948 A1 | 9/2008 | van der Meulen et al. |
| 2008/0253868 A1 | 10/2008 | Talmer |
| 2008/0255798 A1 | 10/2008 | Buzan |
| 2012/0213614 A1 | 8/2012 | Bonora et al. |

FOREIGN PATENT DOCUMENTS

| | | | |
|---|---|---|---|
| EP | 0597637 | 5/1994 | |
| JP | 6338555 | 12/1994 | |
| JP | 7099224 | 11/1995 | |
| JP | 7172578 | 11/1995 | |
| JP | 7211762 | 11/1995 | |
| JP | 2000177842 | 6/2000 | |
| JP | 2002270672 | 9/2002 | |
| JP | 2003150219 | 5/2003 | |
| JP | 200593807 | 4/2005 | |
| WO | WO 03017354 A1 * | 2/2003 | ....... H01L 21/67109 |
| WO | 2004114739 | 12/2004 | |
| WO | 2005048313 | 5/2005 | |
| WO | 2005091337 | 9/2005 | |
| WO | 2006121931 | 11/2006 | |
| WO | 2007070812 | 6/2007 | |
| WO | 2007101228 | 9/2007 | |
| WO | 2007103870 | 9/2007 | |
| WO | 2007103887 | 9/2007 | |
| WO | 2007103896 | 9/2007 | |
| WO | 2008030637 | 3/2008 | |

OTHER PUBLICATIONS

Gardner, "Semiconductor Factory Automation: Designing for Phased Automation", IEEE, (1996), pp. 207-213.
USPTO Office Action dated Jul. 28, 2008, U.S. Appl. No. 11/876,904.
Supplementary European Search Report; Application No. EP04818697; dated Apr. 4, 2011.
USPTO Office Action, dated Dec. 1, 2009, U.S. Appl. No. 11/832,491.
USPTO Office Action, dated Jun. 10, 2010, U.S. Appl. No. 11/382,491.
USPTO Office Action, dated Apr. 19, 2011, U.S. Appl. No. 11/382,491.
USPTO Office Action, dated Dec. 16, 2009, U.S. Appl. No. 11/846,290.
USPTO Office Action, dated Aug. 25, 2010, U.S. Appl. No. 11/846,290.
USPTO Office Action, dated Jan. 31, 2007, U.S. Appl. No. 10/985,834.
USPTO Office Action, dated Aug. 2, 2007, U.S. Appl. No. 10/985,834.
USPTO Office Action, dated Aug. 6, 2007, U.S. Appl. No. 10/985,839.
USPTO Office Action, dated Apr. 30, 2008, U.S. Appl. No. 10/985,839.
USPTO Office Action, dated Apr. 5, 2010, U.S. Appl. No. 12/206,382.
USPTO Office Action, dated Dec. 17, 2010, U.S. Appl. No. 12/206,382.
Kumar, Rajeev: "A Neural Net Complier System for Hierarchical Organization," ACM SIGPLAN Notices vol. 36(2), (Feb. 2001), pp. 26-36.
Harper, et al. "Flexible Material Handling Automation in Wafer Fabrication", Solid State Technology, Veeco Integrated Automation, Inc., Dallas, TX, (Jul. 1994), pp. 89-94.
Weiss, Mitchell. "The Automated Semiconductor Fabricator Circa 2020", PRI Automation, Inc. Billerica, MA.
ITRS Factory Integration TWG. "ITRS 2001 Factory Integration Chapter Material: Handling Backup Section", (Oct. 20, 2005).
International Search Report, PCT/US2006/061960, (dated Jul. 11, 2008).
USPTO Office Action, dated Aug. 28, 2007; U.S. Appl. No. 11/427,723.
USPTO Office Action, dated Aug. 23, 2007; U.S. Appl. No. 11/123,966.
USPTO Office Action, dated Aug. 23, 2007; U.S. Appl. No. 11/428,136.
International Search Report, PCT/US2006/017543, (dated Sep. 25, 2007).
Microsoft Computer Dictionary, (2003), p. 360.
Baglivo, et al. "An Integrated Hardware/Software Platform for Both Simulation and Real-Time Autonomous Guided Vehicle Navigation", ECMS, 19th European Conference on Modeling and Simulation, (Jun. 2005), pp. 1-6.
Gholkar, et al. "Hardware-in-Loop Simulator for Mini Aerial Vehicle", Center for Aerospace Systems Design and Engineering, (2004), pp. 1-6.
Hong, et al. "A PC-Based Open Robot Control System: PC-ORC", Science Direct, (Jun. 2001), pp. 1901-1906.
Samaka, M. "Robot Task-Level Programming Language and Simulation", PWASET vol. 9, (Nov. 2005), pp. 99-103.
Morandini, et al. "A Real-Time Hardware-in-the-Loop Simulator for Robotics Applications", Mulitbody Dynamics 2005, ECCOMAS Thematic Conference, (Jun. 2005), pp. 1-11.
USPTO Office Action, dated Jul. 10, 2008, U.S. Appl. No. 11/123,966.
USPTO Office Action, dated Aug. 6, 2008, U.S. Appl. No. 12/032,463.
USPTO Office Action, dated Aug. 18, 2008, U.S. Appl. No. 12/032,405.
USPTO Office Action, dated Sep. 3, 2008, U.S. Appl. No. 10/985,730.
USPTO Office Action, dated Sep. 9, 2008, U.S. Appl. No. 10/985,844.
USPTO Office Action, dated Sep. 18, 2008, U.S. Appl. No. 11/876,854.
USPTO Office Action, dated Sep. 18, 2008, U.S. Appl. No. 11/876,865.
USPTO Office Action, dated Sep. 19, 2008, U.S. Appl. No. 11/876,886.
USPTO Office Action, dated Sep. 19, 2008, U.S. Appl. No. 11/876,887.
International Search Report, PCT/US2006/061960, dated Sep. 4, 2008.
USPTO Office Action, dated Aug. 27, 2007, U.S. Appl. No. 11/123,966.
Baglivo, et al. "An Integrated Hardware/Software Platform for Both Simulation and Real-Time Autonomous Guided Vehicles Navigation", ECMS 2005, 19th European Conference on Modeling and Simluation, (Jun. 2005), pp. 1-6.
USPTO Notice of Alloance, dated Jun. 19, 2008, U.S. Appl. No. 10/985,839.
Grabowski, Ralph. "Using AutoCAD 2005: Basics", Autodesk Press, (Aug. 17, 2004), p. 213.
USPTO Notice of Allowance, dated Sep. 28, 2008, U.S. Appl. No. 10/985,834.
USPTO Office Action, dated Jun. 20, 2012, U.S. Appl. No. 11/876,869.
USPTO Office Action, dated Dec. 27, 2010, U.S. Appl. No. 11/876,876.
USPTO Office Action, dated May 23, 2012, U.S. Appl. No. 11/876,896.
USPTO Office Action, dated Dec. 2, 2011, U.S. Appl. No. 11/876,915.
USPTO Office Action, dated Apr. 3, 2012, U.S. Appl. No. 11/876,902.
USPTO Final Office Action, dated May 25, 2012, U.S. Appl. No. 12/025,516.
USPTO Final Office Action, dated Jun. 2, 2011, U.S. Appl. No. 12/025,541.
USPTO Final Office Action, dated Dec. 24, 2008, U.S. Appl. No. 12/025,582.
West, et al. "Design Issues Associated with Neural Network Systems Applied Within the Electronics Manufacturing Domain", Sep. 2000, Journal of Electronics Manufacturing, vol. 10, No. 1, pp. 19-48.
Maimon, et al. "A Neural Network Approach for a Robot Task Sequencing Problem", Artificial Intelligence in Engineering, 14 (2000), pp. 175-189.
Zhou, et al. "Modeling, Analysis, Simulation, Scheduling, and Control of Semiconductor Manufacturing Systems: A Petri Net Approach", Aug. 1998, IEEE Transactions on Semiconductor Manufacturing, vol. 11, No. 3, pp. 333-357.
Westkamper, et al. "Chapter 28: Production, Planning and Control with Learning Technologies: Simulation and Optimization of Com-

(56) References Cited

OTHER PUBLICATIONS plex Production Processes in Knowledge-Based Systems", Academic Press, vol. 3, (2000) pp. 839-887.
International Search Report, PCT/US2007/067965, dated Oct. 1, 2008.
Hesselroth, et al. "Neural Network Control of a Pneumatic Robot Arm", IEEE Transactions on Systems, Man, and Cybernetics, vol. 24, No. 1, (Jan. 1994) pp. 28-38.
"PCT Notification of Transmittal of the International Search Report or the Declaration, PCT/US04/37672", International Searching Authority dated Dec. 19, 2005.
USPTO Office Action dated Jul. 3, 2008; U.S. Appl. No. 11/876,910.

* cited by examiner

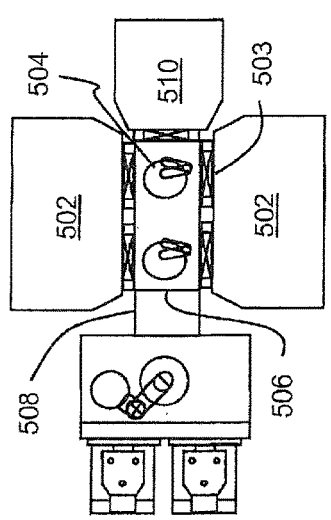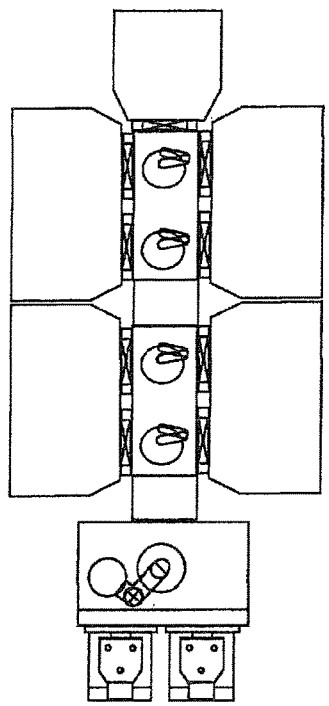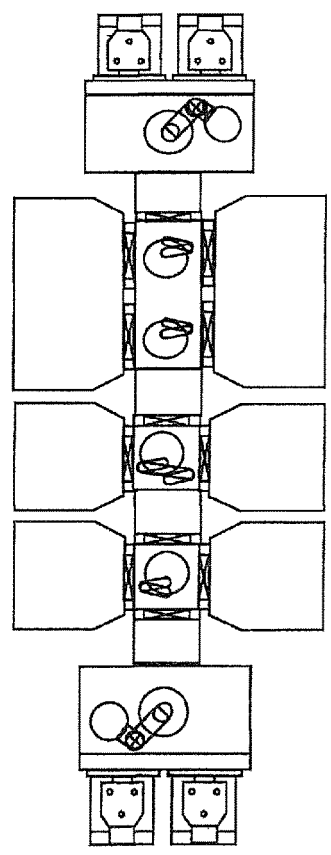

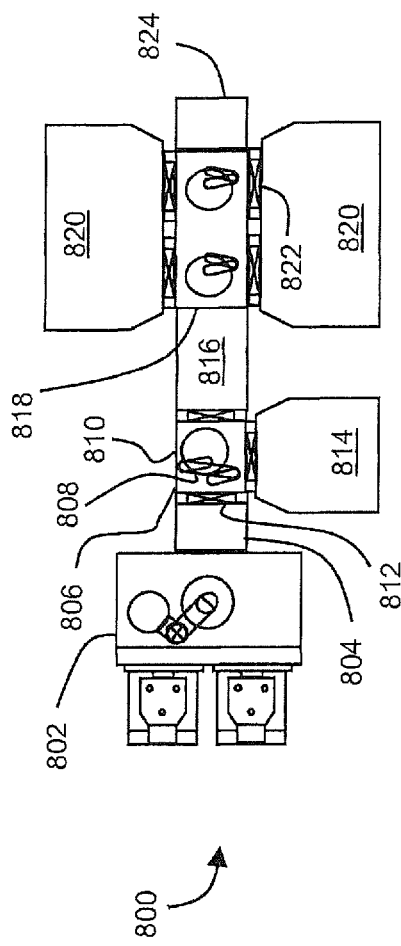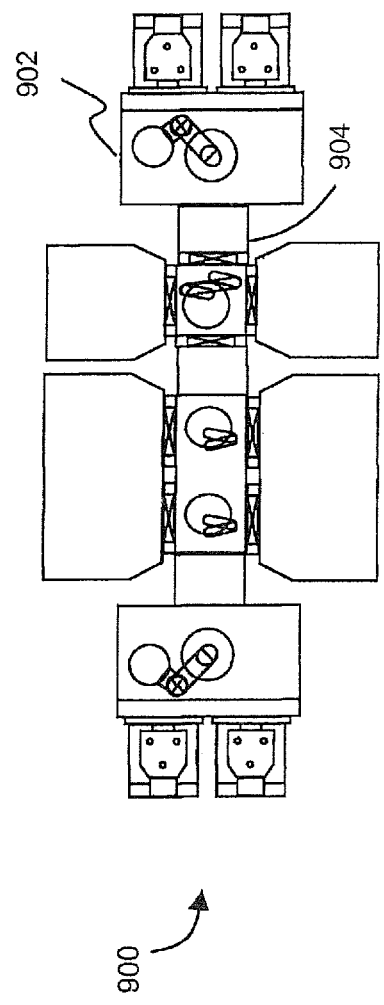

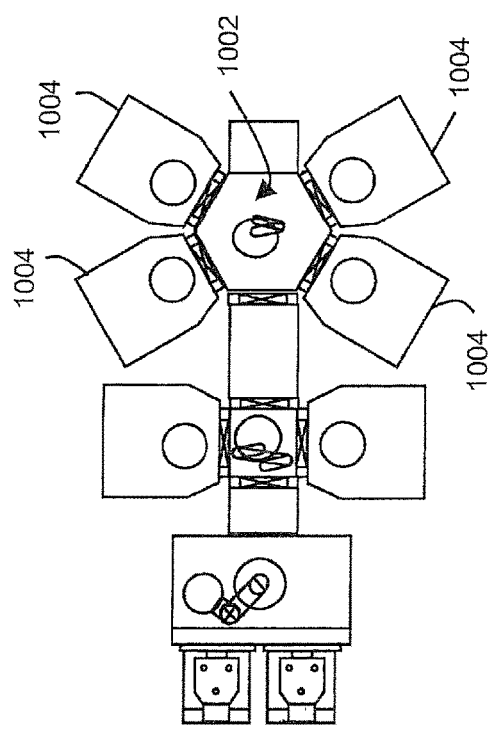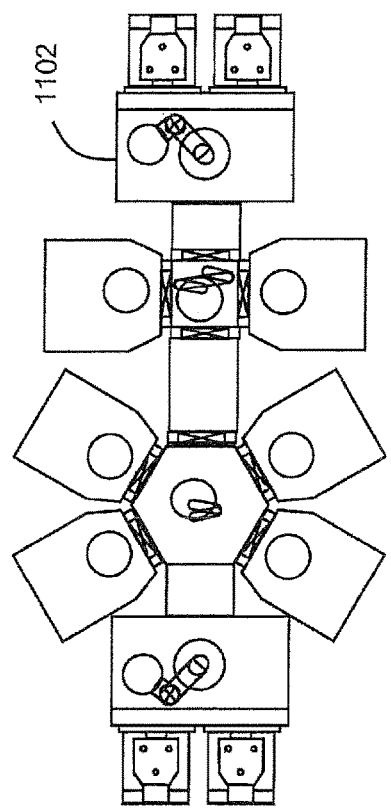

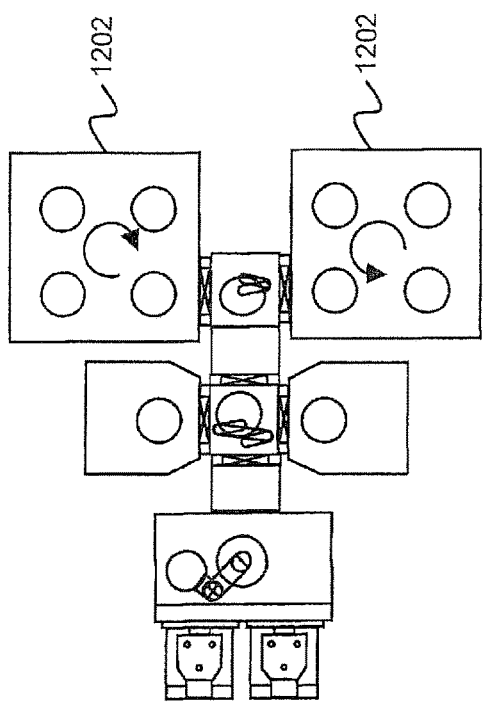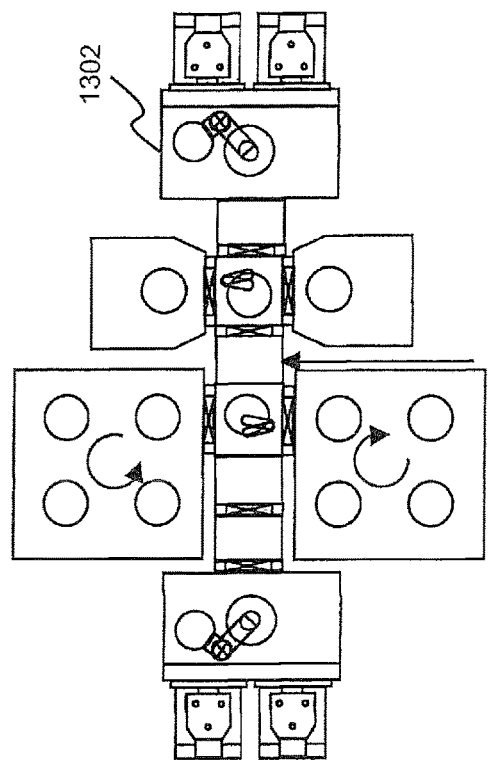

SEMICONDUCTOR MANUFACTURING SYSTEMS

CROSS REFERENCE TO RELATED APPLICATIONS

This is a continuation of U.S. patent application Ser. No. 13/248,386 filed on Sep. 29, 2011 (now U.S. Pat. No. 8,523,507 issued on Sep. 3, 2013) which is a divisional application of application Ser. No. 12/239,717, filed Sep. 26, 2008 which is a continuation-in-part of application Ser. No. 11/679,829, filed Feb. 27, 2007, which claims priority under 35 U.S.C. § 119(e) to prior U.S. provisional application Ser. No. 60/777,443, filed Feb. 27, 2006, and is also a continuation-in-part of application Ser. No. 10/985,834, filed Nov. 10, 2004, which claims priority under 35 U.S.C. § 119(e) to prior U.S. provisional application Ser. Nos. 60/518,823, filed Nov. 10, 2003, 60/607,649, filed Sep. 7, 2004 and 60/975,350, filed Sep. 26, 2007 the disclosures of which are incorporated herein in their entireties.

BACKGROUND

This invention relates to the field of semiconductor manufacturing.

While various process modules and other semiconductor handling and fabrication tools are available, there remains a need for modular systems arranged to balance processing capacity for relatively fast processes such as bevel etching and relatively slow processes such as enhanced plasma chemical vapor deposition. More generally, a need exists for improved semiconductor manufacturing and handling equipment.

SUMMARY

This is a divisional application of application Ser. No. 10/434,582, filed May 9, 2003 which claims priority under 35 U.S.C. § 119(e) to prior U.S. provisional application Ser. Nos. 60/378,983, 60/379,095 and 60/379,063; all filed May 9, 2002, the disclosures of which are incorporated herein by reference.

This is a divisional application of application Ser. No. 10/434,582, filed May 9, 2003 which claims priority under 35 U.S.C. § 119(e) to prior U.S. provisional application Ser. Nos. 60/378,983, 60/379,095 and 60/379,063; all filed May 9, 2002, the disclosures of which are incorporated herein by reference.

This is a divisional application of application Ser. No. 10/434,582, filed May 9, 2003 which claims priority under 35 U.S.C. § 119(e) to prior U.S. provisional application Ser. Nos. 60/378,983, 60/379,095 and 60/379,063; all filed May 9, 2002, the disclosures of which are incorporated herein by reference.

Linear semiconductor handling systems provide more balanced processing capacity using various techniques to provide increased processing capacity to relatively slow processes. This may include use of hexagonal vacuum chambers to provide additional facets for slow process modules, use of circulating process modules to provide more processing capacity at a single facet of a vacuum chamber, or the use of wide process modules having multiple processing sites. This approach may be used, for example, to balance processing capacity in a typical process that includes plasma enhanced chemical vapor deposition steps and bevel etch steps.

In one aspect, an apparatus described herein includes an equipment front end module that physically handles workpieces in atmosphere; a load lock coupled to the equipment front end module and positioned to receive workpieces therefrom, the load lock providing for transfer of workpieces between atmosphere and a vacuum environment; a first vacuum chamber containing a robot, the first vacuum chamber having four facets, one of the four facets selectively coupled to the load lock by an isolation valve; two process modules that provide a first process, the two process modules coupled in a vacuum-sealed engagement to two opposing ones of the four facets in a vacuum-sealed engagement; two wide process modules, each having two entrances, and each providing a second process; and a second vacuum chamber containing two robots and a transfer station, the second vacuum chamber coupled in a vacuum-sealed engagement to one of the four facets of the first vacuum chamber, the two wide process modules positioned on opposing sides of the second vacuum chamber with each of the robots of the second vacuum chamber positioned between an entrance of each of the two wide process modules, the robots further positioned to transfer workpieces between one another; wherein workpieces can be transferred among the load lock, the two process modules, and the two wide process modules in vacuum by the robots of the first vacuum chamber and the second vacuum chamber, and wherein a processing speed of the two process modules is substantially balanced with the processing speed of the two wide process modules.

In another aspect, an apparatus described herein includes an equipment front end module that physically handles workpieces in atmosphere; a load lock coupled to the equipment front end module and positioned to receive workpieces therefrom, the load lock providing for transfer of workpieces between atmosphere and a vacuum environment; a first vacuum chamber containing a robot, the first vacuum chamber having four facets, one of the four facets selectively coupled to the load lock by an isolation valve; two process modules that provide a first process, the two process modules coupled in a vacuum-sealed engagement to two opposing ones of the four facets in a vacuum-sealed engagement; four process modules that provide a second process, the four process modules each having an entrance, and each providing a second process; and a second vacuum chamber containing a second robot, the second vacuum chamber having six facets, the second vacuum chamber coupled in a vacuum-sealed engagement to one of the four facets of the first vacuum chamber, and four of the six facets coupled in a vacuum-sealed engagement to each of the four process modules respectively, the second robot positioned to transfer workpieces among the four process modules; wherein workpieces can be transferred among the load lock, the two process modules, and the four process modules in vacuum by the robots of the first vacuum chamber and the second vacuum chamber, and wherein a processing speed of the two process modules is substantially balanced with the processing speed of the four process modules. In another aspect, an apparatus described herein includes an equipment front end module that physically handles workpieces in atmosphere; a load lock coupled to the equipment front end module and positioned to receive workpieces therefrom, the load lock providing for transfer of workpieces between atmosphere and a vacuum environment; a first vacuum chamber containing a robot, the first vacuum chamber having four facets, one of the four facets selectively coupled to the load lock by an isolation valve; two process modules that provide a first process, the two process modules coupled in a vacuum-sealed engagement to two opposing ones of the four facets in a vacuum-sealed engagement; two circulating process modules each having an entrance, and each providing a second process; and a second vacuum chamber containing a second robot, the second vacuum chamber having four facets, the second vacuum chamber coupled in a vacuum-sealed engagement to one of the four facets of the first vacuum chamber, and two of the four facets of the second vacuum chambered coupled in a vacuum-sealed engagement to each of the two circulating process modules respectively, the second robot positioned to transfer workpieces among the two circulating process modules; wherein workpieces can be transferred among the load lock, the two process modules, and the two circulating process modules in vacuum by the robots of the first vacuum chamber and the second vacuum chamber, and wherein a processing speed of the two process modules is substantially balanced with the processing speed of the two circulating process modules.

As used herein, "robot" shall include any kind of known robot or similar device or facility that includes a mechanical capability and a control capability, which may include a combination of a controller, processor, computer, or similar facility, a set of motors or similar facilities, one or more resolvers, encoders or similar facilities, one or more mechanical or operational facilities, such as arms, wheels, legs, links, claws, extenders, grips, nozzles, sprayers, end effectors, actuators, and the like, as well as any combination of any of the above. One embodiment is a robotic arm.

As used herein "drive" shall include any form of drive mechanism or facility for inducing motion. In embodiments it includes the motor/encoder section of a robot.

As used herein, "axis" shall include a motor or drive connected mechanically through linkages, belts or similar facilities, to a mechanical member, such as an arm member. An "N-axis drive" shall include a drive containing N axes; for example a "2-axis drive" is a drive containing two axes.

As used herein, "arm" shall include a passive or active (meaning containing motors/encoders) linkage that may include one or more arm or leg members, bearings, and one or more end effectors for holding or gripping material to be handled.

As used herein, "SCARA arm" shall mean a Selectively Compliant Assembly Robot Arm (SCARA) robotic arm in one or more forms known to those of skill in the art, including an arm consisting of one or more upper links connected to a drive, one or more lower links connected through a belt or mechanism to a motor that is part of the drive, and one or more end units, such as an end effector or actuator.

As used herein, "turn radius" shall mean the radius that an arm fits in when it is fully retracted.

As used herein, "reach" shall include, with respect to a robotic arm, the maximum reach that is obtained when an arm is fully extended. Usually the mechanical limit is a little further out than the actual effective reach, because it is easier to control an arm that is not completely fully extended (in embodiments there is a left/right singularity at full extension that can be hard to control).

As used herein, "containment" shall mean situations when the arm is optimally retracted such that an imaginary circle can be drawn around the arm/end effector/material that is of minimum radius.

As used herein, the "reach-to-containment ratio" shall mean, with respect to a robotic arm, the ratio of maximum reach to minimum containment.

As used herein, "robot-to-robot" distance shall include the horizontal distance between the mechanical central axis of rotation of two different robot drives.

As used herein, "slot valve" shall include a rectangular shaped valve that opens and closes to allow a robot arm to pass through (as opposed to a vacuum (isolation) valve, which controls the pump down of a vacuum chamber). For example, the SEMI E21.1-1296 standard (a published standard for semiconductor manufacturing) the slot valve for 300 mm wafers in certain semiconductor manufacturing process modules has an opening width of 336 mm, a opening height of 50 mm and a total valve thickness of 60 mm with the standard also specifying the mounting bolts and alignment pins.

As used herein, "transfer plane" shall include the plane (elevation) at which material is passed from a robot chamber to a process module chamber through a slot valve. Per the SEMI E21.1-1296 standard for semiconductor manufacturing equipment the transfer plane is 14 mm above the slot valve centerline and 1100 mm above the plane of the factory floor.

As used herein, "section" shall include a vacuum chamber that has one or more robotic drives in it. This is the smallest repeatable element in a linear system.

As used herein, "link" shall include a mechanical member of a robot arm, connected on both ends to another link, an end effector, or the robot drive.

As used herein, "L1," "L2", "L3" or the like shall include the numbering of the arm links starting from the drive to the end effector.

As used herein, "end effector" shall include an element at an active end of a robotic arm distal from the robotic drive and proximal to an item on which the robotic arm will act. The end effector may be a hand of the robot that passively or actively holds the material to be transported in a semiconductor process or some other actuator disposed on the end of the robotic arm.

As used herein, the term "SCARA arm" refers to a robotic arm that includes one or more links and may include an end effector, where the arm, under control, can move linearly, such as to engage an object. A SCARA arm may have various numbers of links, such as 3, 4, or more. As used herein, "3-link SCARA arm" shall include a SCARA robotic arm that has three members: link one (L1), link two (L2) and an end effector. A drive for a 3-link SCARA arm usually has 3 motors: one connected to L1, one to the belt system, which in turn connects to the end effector through pulleys and a Z (lift) motor. One can connect a fourth motor to the end effector, which allows for some unusual moves not possible with only three motors.

As used herein, "dual SCARA arm" shall include a combination of two SCARA arms (such as two 3 or 4-link SCARA arms (typically designated A and B)) optionally connected to a common drive. In embodiments the two SCARA arms are either completely independent or share a common link member L1. A drive for a dual independent SCARA arm usually has either five motors: one connected to L1-A, one connected to L1-B, one connected to the belt system of arm A, one connected to the belt system of arm B, and a common Z (lift) motor. A drive for a dual dependent SCARA arm usually has a common share L1 link for both arms A and B and contains typically four motors: one connected to the common link L1, one connected to the belt system for arm A, one connected to the belt system for arm B, and a common Z (lift) motor.

As used herein, "4-link SCARA arm" shall include an arm that has four members: L1, L2, L3 and an end effector. A drive for a 4-link SCARA arm can have four motors: one connected to L1, one to the belt systems connected to L2 and L3, one to the end effector and a Z motor. In embodiments only 3 motors are needed: one connected to L1, one connected to the belt system that connects to L2, L3 and the end effector, and a Z motor.

As used herein, "Frog-leg style arm" shall include an arm that has five members: L1A, L1B, L2A, L3B and an end effector. A drive for a frog-leg arm can have three motors, one connected to L1A—which is mechanically by means of gearing or the like connected to L1B—, one connected to a turret that rotates the entire arm assembly, and a Z motor. In embodiments the drive contains three motors, one connected to L1A, one connected to L1B and a Z motor and achieves the desired motion through coordination between the motors.

As used herein, "Dual Frog-leg style arm" shall include an arm that has eight members L1A, L1B, L2A-1, L2A-2, L2B-1, L2B-2 and two end effectors. The second link members L2A-1 and L2B-1 form a single Frog-leg style arm, whereas the second link members L2A-2 and L2B-2 also form a single Frog-leg style arm, however facing in an opposite direction. A drive for a dual frog arm may be the same as for a single frog arm.

As used herein, "Leap Frog-leg style arm" shall include an arm that has eight members L1A, L1B, L2A-1, L2A-2, L2B-1, L2B-2 and two end effectors. The first link members L1A and L1B are each connected to one of the motors substantially by their centers, rather than by their distal ends. The second link members L2A-1 and L2B-1 form a single Frog-leg style arm, whereas the second link members L2A-2 and L2B-2 also form a single Frog-leg style arm, however facing in the same direction. A drive for a dual frog arm may be the same as for a single frog arm.

BRIEF DESCRIPTION OF THE FIGURES

The foregoing and other objects and advantages of the invention will be appreciated more fully from the following further description thereof, with reference to the accompanying drawings, wherein:

FIG. 5 shows a system using wide process modules.

FIG. 6 shows another system using multiple wide process modules.

FIG. 7 shows another system using multiple wide process modules.

FIG. 8 shows a system employing wide process modules to balance processing capacity.

FIG. 9 shows a system employing wide process modules to balance processing capacity.

FIG. 10 shows a system employing a hexagonal vacuum chamber to balance processing capacity.

FIG. 11 shows a system employing a hexagonal vacuum chamber to balance processing capacity.

FIG. 12 shows a system employing two circulating process modules to balance processing capacity.

FIG. 13 shows a system employing circulating process modules to balance processing capacity.

DETAILED DESCRIPTION

Figure 1:
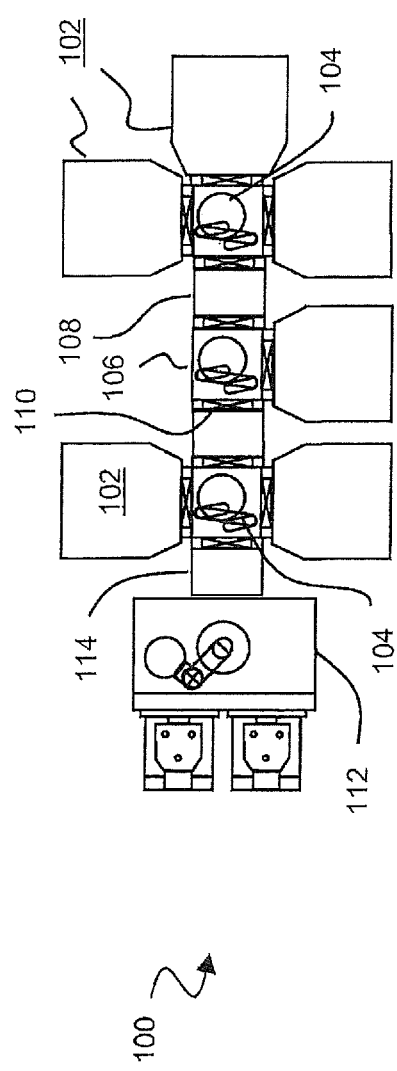
FIG. 1 shows a linear processing architecture for handling items in a semiconductor fabrication process.

FIG. 1 shows a linear processing architecture for handling items in a semiconductor fabrication process. The system 100 may include a number of process modules 102 for various processes such as chemical vapor deposition processes, etching processes, and the like. As semiconductor manufacturing processes are typically extremely sensitive to contaminants, such as particulates and volatile organic compounds, the processes typically take place in a vacuum environment, with one or more process modules 102 that are devoted to specific processes. Semiconductor wafers are moved among the process modules 102 by a handling system that may include one or more robots 104 to produce the end product, such as a chip.

Figures 14A, 14B:
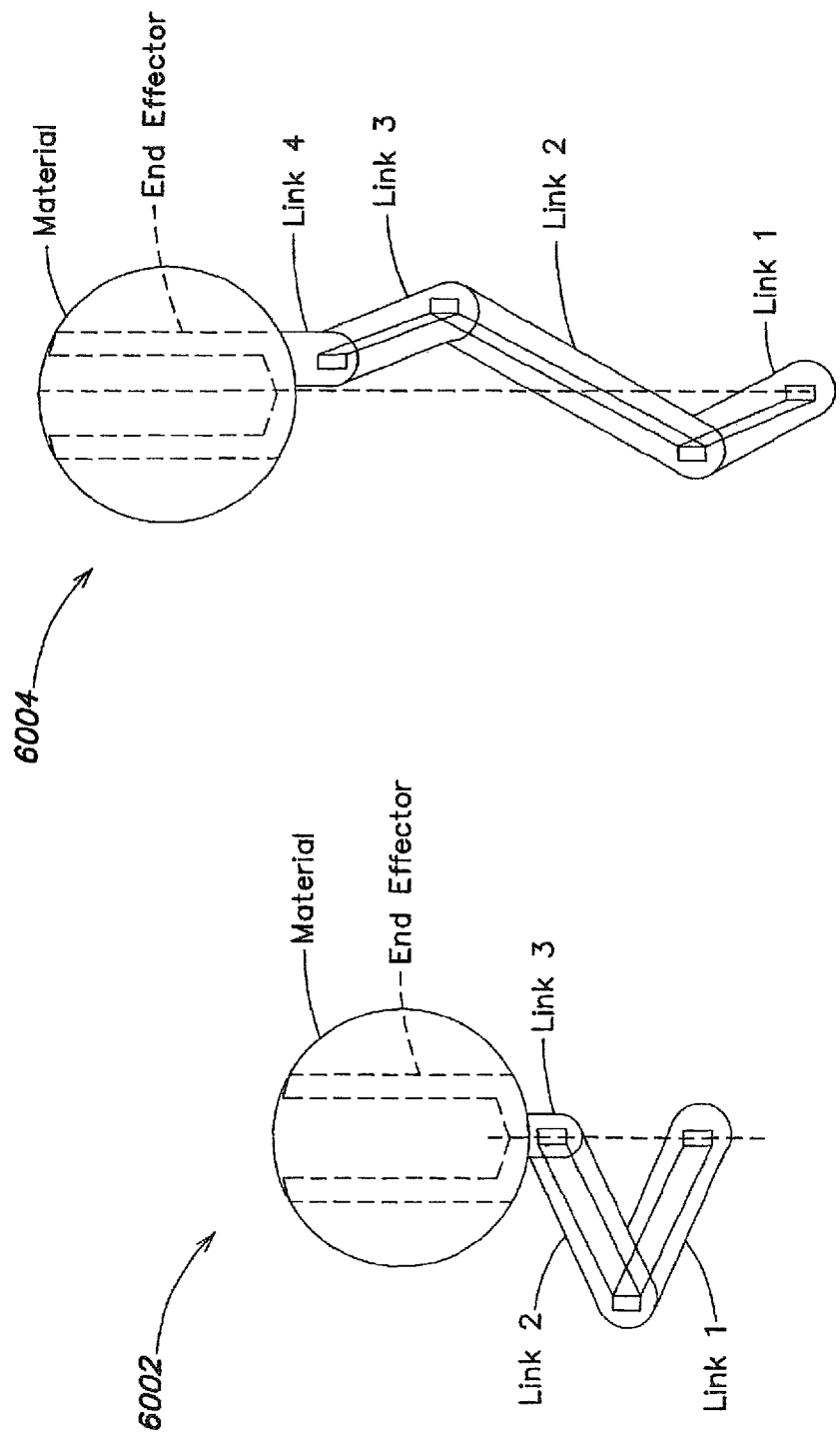
FIGS. 14A and 14B show a 3-link SCARA arm and a 4-link SCARA arm.

FIGS. 14A and 14B show a 3-link SCARA arm 6002 and a 4-link SCARA arm 6004. The 3-link or 4-link arms 6002, 6004 are driven by a robot drive. The 3-link arm 6002 is commonly used in industry. When the 3-link SCARA arm 6002 is used, the system is not optimized in that the reach-to-containment ratio is not very good. Thus, the vacuum chambers need to be bigger, and since costs rise dramatically with the size of the vacuum chamber, having a 3-link SCARA arm 6002 can increase the cost of the system. Also the overall footprint of the system becomes bigger with the 3-link SCARA arm 6002. Moreover, the reach of a 3-link SCARA arm 6002 is less than that of a 4-link arm 6004. In some cases a manufacturer may wish to achieve a large, deep handoff into a process module, and the 4-link arm 6004 reaches much farther beyond its containment ratio. This has advantages in some non-SEMI-standard process modules. It also has advantages when a manufacturer wants to cover large distances between segments.

The 4-link arm 6004 is advantageous in that it folds in a much smaller containment ratio than a 3-link SCARA arm 6002, but it reaches a lot further than a conventional 3-link SCARA 6002 for the same containment diameter. In combination with the ability to have a second drive and second 4-link arm 6004 mounted on the top of the system, it may allow for a fast material swap in the process module. The 4-link SCARA arm 6004 may be mounted, for example, on top of a stationary drive as illustrated, or on top of a moving cart that provides the transmission of the rotary motion to actuate the arms and belts. In either case, the 4-link arm 6004, optionally together with a second 4-link arm 6004, may provide a compact, long-reach arm that can go through a small opening, without colliding with the edges of the opening.

Figure 15:
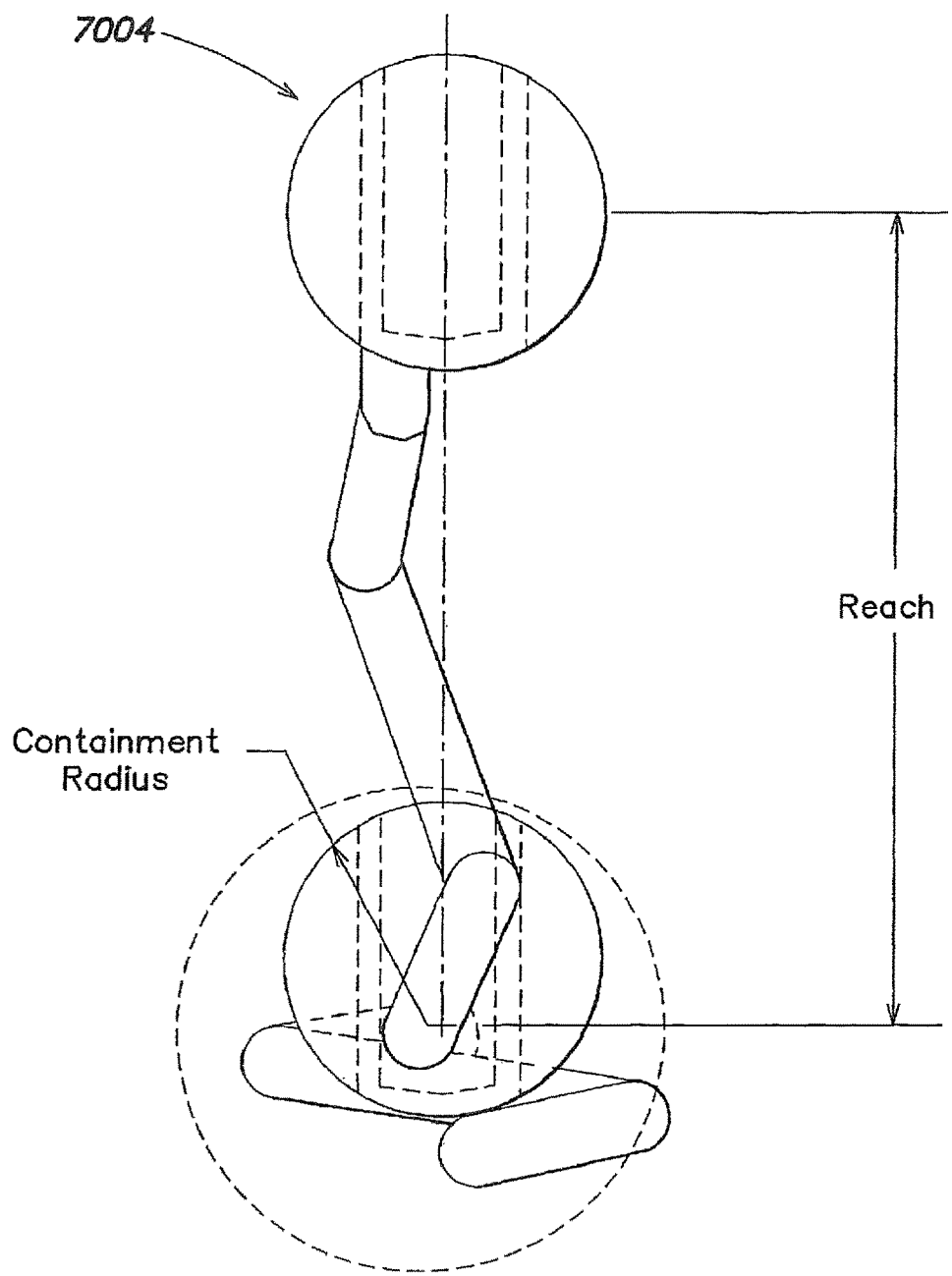
FIG. 15 shows reach and containment characteristics of a SCARA arm.

FIG. 15 shows reach and containment characteristics of a 4-link SCARA arm 7004. In embodiments, the 4-link SCARA arm 7004 link lengths are not constrained by the optimization of reach to containment ratio as in some other systems. Optimization of the reach to containment ratio may lead to a second arm member that is too long. When the arm reaches through a slot valve that is placed as close as practical to the minimum containment diameter, this second arm member may collide with the inside edges of the slot valve. Thus the second (and third) links may be dimensioned based on collision avoidance with a slot valve that the arm is designed to reach through. This results in very different ratios between L1, L2 and L3. The length of L2 may constrain the length of L3. An equation for optimum arm length may be a 4th power equation amenable to iterative solutions.

Figure 16:
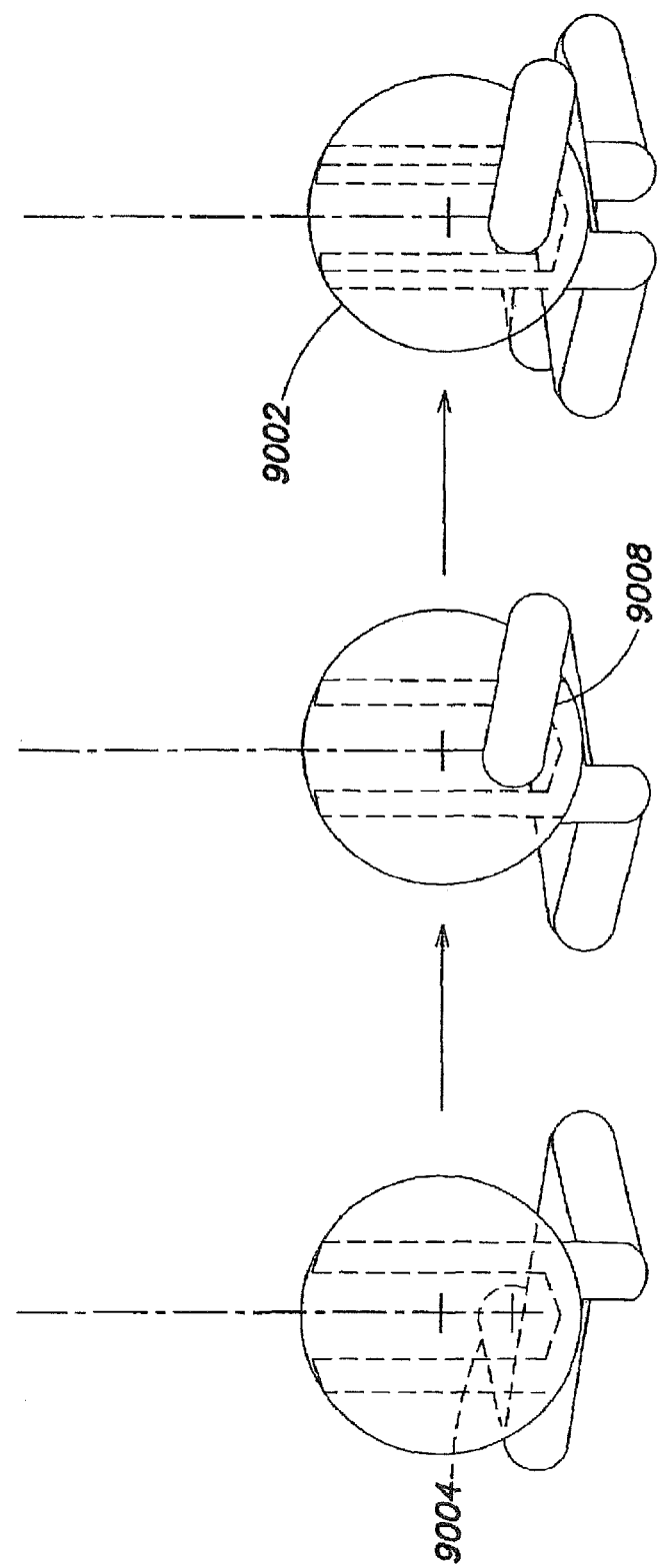
FIG. 16 shows components of a dual-arm architecture for a robotic arm system for use in a handling system.

FIG. 16 shows components of a dual-arm 9002 architecture for a robotic arm system for use in a handling system. One arm is mounted from the bottom 9004 and the other from the top 9008. In embodiments both are 4-link SCARA arms. Mounting the second arm on the top is advantageous. In some other systems arms have been connected to a drive that is mounted through the top of the chamber, but the lower and upper drives are conventionally mechanically coupled. In embodiments, there is no mechanical connection between the two drives in the linear systems disclosed herein; instead, the coordination of the two arms (to prevent collisions) may be done in a software system or controller. The second (top) arm 9008 may optionally be included only if necessary for throughput reasons.

Another feature is that only two motors, just like a conventional SCARA arm, may be needed to drive the 4-link arm. Belts in the arm may maintain parallelism. Parallelism or other coordinated movements may also be achieved, for example, using parallel bars instead of belts. Generally, the use of only two motors may provide a substantial cost advantage. At the same time, three motors may provide a functional advantage in that the last (L4) link may be independently steered, however the additional belts, bearings, connections, shafts and motor may render the system much more expensive. In addition the extra belts may add significant thickness to the arm mechanism, making it difficult to pass the arm through a (SEMI standard) slot valve. Also, the use of fewer motors generally simplifies related control software.

Another feature of the 4-link SCARA arm disclosed herein is that the wrist may be offset from centerline. Since the ideal system has a top-mount 9008 as well as a bottom 9004 mount 4-link arm, the vertical arrangement of the arm members may be difficult to adhere to if the manufacturer also must comply with the SEMI standards. In a nutshell, these standards specify the size and reach requirements through a slot valve 4006 into a process module. They also specify the level above centerline on which a wafer has to be carried. Many existing process modules are compliant with this standard. In systems that are non-compliant, the slot valves 4006 are of very similar shape although the opening size might be slightly different as well as the definition of the transfer plane. The SEMI standard dimensional restrictions require a very compact packaging of the arms. Using an offset wrist allows the top 9008 and bottom 9004 arms to get closer together, making it easier for them to pass through the slot valve 4006. If the wrist is not offset, then the arms need to stay further apart vertically and wafer exchanges may take more time, because the drives need to move more in the vertical direction. The proposed design of the top arm does not require that there is a wrist offset, but a wrist offset may advantageously reduce the turn radius of the system, and allows for a better mechanical arm layout, so no interferences occur.

Various configurations exist for handling systems. A prevalent system is a cluster tool, where process modules are positioned radially around a central handling system, such as a robotic arm. In other embodiments, a handling system can rotate items horizontally in a "lazy Susan" facility. Process modules 102 may in general be clustered, stacked, or arranged in a linear fashion as depicted in FIG. 1. A given chip may require chemical vapor deposition of different chemical constituents (e.g., Titanium Nitride, Tungsten, etc.) in different process modules, as well as etching in other process modules. The sequence of the processes in the different process modules may produce a unique end product.

In general, the system 100 may use two or more stationary robots 104 arranged in a linear fashion. The robots 104 may be mounted in the bottom of the system 100 or hang down from the chamber lid or both at the same time. The linear system may use a vacuum chamber 106 around each robot, and may have multiple connected vacuum chambers 106, each containing its own robot 104 arranged in a linear fashion. In general, different forms of robots can be used in semiconductor manufacturing equipment. Possible robots include 3-link Selective Compliant Articulated Robot Arm ("SCARA") robot, a 4-link SCARA robot, a dual-arm robot, a frog-leg arm robot, and so forth.

In embodiments, a single controller could be set up to handle one or more sections of the system 100. In embodiments vacuum chambers 106 are extensible; that is, a manufacturer can easily add additional sections/chambers 106 and thus add process capacity. Because each section can use independent robot arms and robot drives, the throughput may stay high when additional sections and thus robots 104 are added.

In embodiments the components of the system 100 can be controlled by a software controller, which in embodiments may be a central controller that controls each of the components. In embodiments the components form a linkable handling system under control of the software, where the software controls each robot to hand off a material to another robot, or into a buffer for picking up by the next robot. In embodiments the software control system may recognize the addition of a new component, such as a process module or robot, when that component is plugged into the system, such as recognizing the component over a network, such as a USB, Ethernet, FireWire, Bluetooth, 802.11a, 802.11b, 802.11g or other network. In such embodiments, as soon as the next robot, process module, or other component is plugged in a software scheduler for the flow of a material to be handled, such as a wafer, can be reconfigured automatically so that the materials can be routed over the new link in the system. In embodiments the software scheduler is based on a neural net, or it can be a rule-based scheduler. In embodiments process modules can make themselves known over such a network, so that the software controller knows what new process modules, robots, or other components have been connected. When a new process module is plugged into an empty facet, the system can recognize it and allow it to be scheduled into the flow of material handling.

In embodiments the software system may include an interface that permits the user to run a simulation of the system. The interface may allow a user to view the linking and configuration of various links, robotic arms and other components, to optimize configuration (such as by moving the flow of materials through various components, moving process modules, moving robots, or the like), and to determine what configuration to purchase from a supplier. In embodiments the interface may be a web interface.

The methods and system disclosed herein can use optional buffer stations 108 between robot drives. Robots could hand off to each other directly, but that is technically more difficult to optimize, and would occupy two robots, because they would both have to be available at the same time to do a handoff, which is more restrictive than if they can deposit to a dummy location 108 in-between them where the other robot can pick up when it is ready. The buffer 108 also allows higher throughput, because the system does not have to wait for both robots to become available. Furthermore, the buffers 108 may also offer a good opportunity to perform some small processing steps on the wafer such as heating, cooling, aligning, inspection, metrology, testing or cleaning.

In embodiments, the methods and systems disclosed herein use optional vacuum isolation valves 110 between robot areas/segments. Each segment can be fully isolated from any other segment. If a robot 104 handles ultra clean and sensitive materials (e.g., wafers) in its segment, then isolating that segment from the rest of the system may prevent cross-contamination from the dirtier segment to the clean segment. Also, the manufacturer can now operate segments at different pressures. The manufacturer can have stepped vacuum levels where the vacuum gets better and better further into the machine. The use of isolation valves 110 may avoid out-gassing from materials or wafers in other parts of the system when handling a wafer in an isolated segment. In embodiments, vacuum isolation between robots 104 is possible, as is material buffering between robots 104.

An equipment front end module 112 or the like may be employed for loading and unloading wafer from the system 100. This may include a variety of robotics, as well as aligners, shelving for wafers and/or wafer carriers, and so forth. Wafers may be transferred between the atmospheric environment of the equipment front end module 112 and the vacuum environment of the process modules 102, robot 104, and so forth through a load lock 114. It should be understood that while in some embodiments a load lock 114 may be positioned at the end of a linear system, as depicted in FIG. 1, the load lock 114 may also or instead be positioned elsewhere, such as in the middle of the system. In such an embodiment, a manufacturing item could enter or exit the system at such another point in the system, such as to exit the system into the air return.

Other features of the system 100 may include an external or air return for moving wafers or groups of wafers in atmosphere, which may optionally be on the top of the linear vacuum chamber. The return system could also be a vacuum return. It should also be understood that while several of the depicted embodiments of linear semiconductor fabrication systems are laid out in a straight line, the linear system could be curvilinear; that is, the system could have curves, a U- or V-shape, an S-shape, or a combination of those or any other curvilinear path, in whatever format the manufacturer desires, such as to fit the configuration of a fabrication facility. In each case, the system optionally includes an entry point and an exit point that is down the line from the entry point. Optionally the air return returns the item from the exit point to the entry point. Optionally the system can include more than one exit point. In each case the robotic arms described herein can assist in efficiently moving items down the line.

In general, the depicted system 100 is arranged to service six process modules (an additional process module may be positioned in the top middle of the depicted system 100, but is omitted here to provide room for element numbers) using three robots 104 with four sided vacuum chambers 106.

It will be further understood that many modifications and additions to the system described above may be usefully employed, including various robot types, various layouts, various process module and robot chamber sizes.

Figure 2:
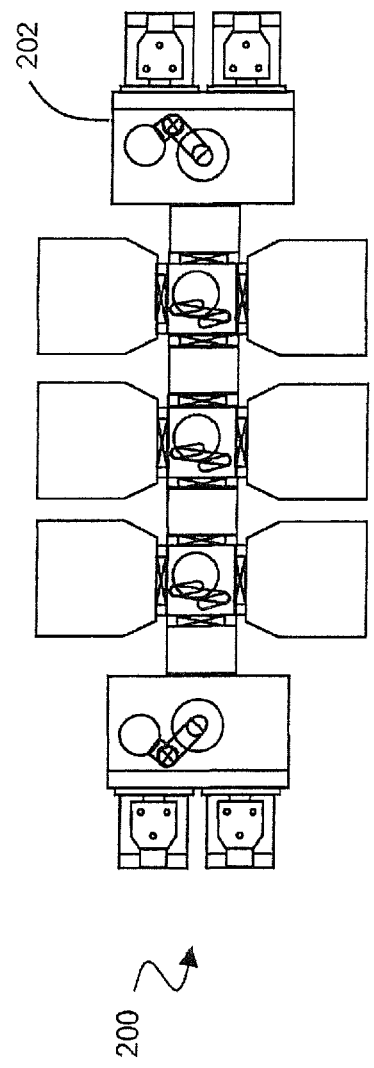
FIG. 2 shows an alternative layout for a system.

FIG. 2 shows an alternative layout for a system 200 that adds a rear-exit handler 202 which may be, for example, similar to the equipment front end module 112 of FIG. 1. This arrangement permits generally left-to-right processing and handling of wafers as well as various other paths through process modules and entry/exit points.

Figure 3:
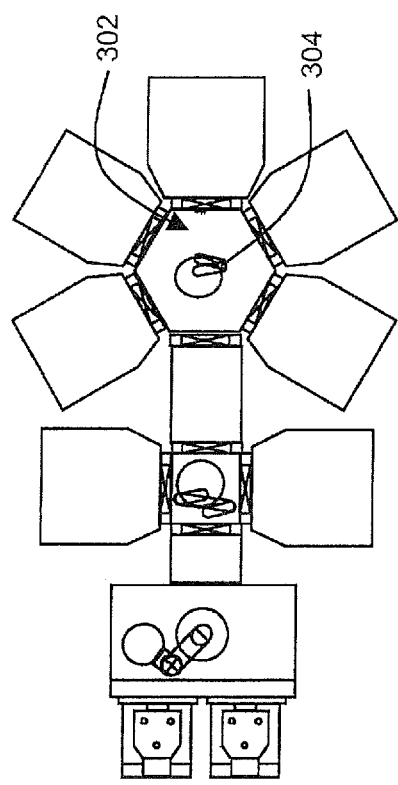
FIG. 3 shows an alternative layout for a system.

FIG. 3 shows an alternative layout for a system 300 using a hexagonal vacuum chamber 302 providing six facets for one of the robots 304. By employing a robotic handler with six facets, a number of additional process modules can be added. This may be particularly useful where a process requires numerous, smaller process modules.

Figure 4:
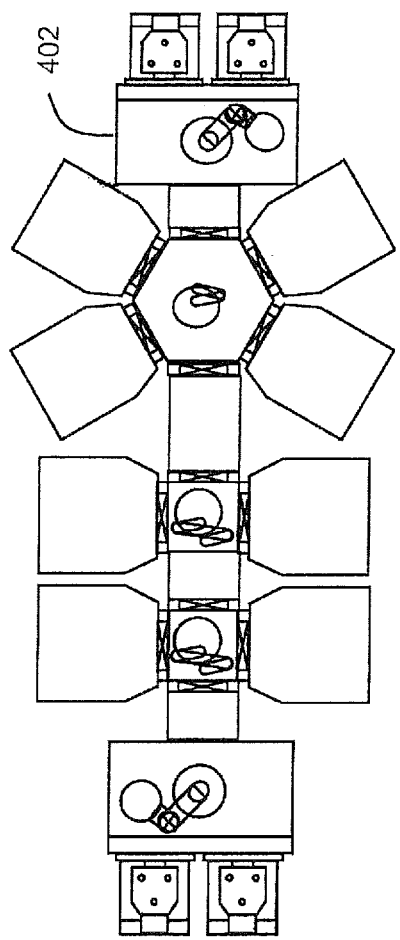
FIG. 4 shows an alternative layout for a system.

FIG. 4 shows an alternative layout for a system 400 using square and hexagonal vacuum chambers, along with a rear-exit handler 402. This arrangement may permit relatively dense clustering of both large and small process modules. In addition, the availability of front and rear access to atmosphere expands options for throughput and scheduling.

FIG. 5 shows a system 500 including wide process modules 502. Each wide process module 502 may have two entrances 503 coupled in a vacuum sealed engagement to a vacuum chamber 506 that contains a number of robots 504. In one embodiment, the robots 504 may be positioned between entrances 503 of opposing wide process modules 502 so that one robot can access an entrance 503 of each one of the process modules. The wide process modules 502 may provide concurrent and/or asynchronous processing of multiple workpieces, which may include, for example, two similar processes that may be accessed independently by the two robots 504 through each of the side-by-side entrances 504. In other embodiments, a wide process module 502 may provide two side-by-side sequential steps or processes, which may be performed entirely within the process module (so that a workpiece enters one entrance and leaves through the other entrance, or by accessing each process through respective entrances with the robots 504. It will be noted that the robots 504 may also affect robot-to-robot handoff among themselves, or transfer workpieces between themselves via a transfer station, buffer station, or the like, so that workpieces may more generally be moved to various facets of the vacuum chamber 506 that contains the robots 504. The robots 504 may thus, for example, transfer a workpiece from a load lock 508 through the vacuum chamber 506 to a process module 510 on an opposing side.

FIG. 6 shows another system 600 using multiple wide process modules. In this embodiment two pairs of wide process modules are arranged on each side of a linear system, with four robots sharing a vacuum environment via an intervening transfer station. Each process module, or each entrance to each process module, may be selectively coupled to the interior of the vacuum chambers by an isolation valve or the like.

FIG. 7 shows another system 700 using multiple wide process modules. It will be noted that wide process modules may be combined with other process modules, which may be selected according to the relative process times thereof to provide balanced capacity between the various processes. Thus in general a wide process module may be provided for processing multiple workpieces where the wide process modules provide a relatively long process, while single-workpiece process modules may be provided for relatively short processes. It will further be noted that a rear-exit handler may be included to add another entry and/or exit point to a vacuum interior of the system 700.

In general, while certain arrangements are depicted, it will be understood that numerous other physical layouts are possible including various placements of wide process modules, other process modules, and the various process modules described below, as well as load locks, front end handlers, and the like, without departing from the scope of this disclosure.

FIG. 8 shows a system employing wide process modules to balance processing capacity.

The system 800 may include an equipment front end module 802 that physically handles workpieces in atmosphere, and assists in transferring workpieces between atmosphere and a vacuum interior of the system 800. The equipment front end module 802 may include buffers, storage shelves, aligners, carrier holders and/or handlers, and so forth.

A load lock 804 may be coupled to the equipment front end module 802 and may be positioned to receive workpieces from the equipment front end module 802. The load lock 804 may in general provide for transfer of workpieces between atmosphere and the vacuum environment within the system 800. Numerous load locks are known in the art, and may be suitably employed with the system 800 as described herein. The load lock 804 may include a preheat station or other processing facility suitable for conditioning workpieces as they enter and/or exit the vacuum environment.

A first vacuum chamber 806 may contain a robot 808 for handling workpieces. The first vacuum chamber 806 may have four facets 810 arranged in a generally square shape, with one of the facets 810 coupled to the load lock 804 by an isolation valve 812 or the like.

Two process modules 814 that provide a first process may be coupled in a vacuum-sealed engagement to two opposing ones of the four facets 810 of the first vacuum chamber 806. It will be understood that only one process module 814 is depicted, but that an opposing facet 810 of the vacuum chamber 806 may readily accommodate an additional process module 814 as described herein. Each process module 814 may also be selectively coupled to the first vacuum chamber 806 by an isolation valve or the like. The two process modules 814 may provide a relatively fast process such as a bevel etch process or the like.

Two wide process modules 820 may be provided, each having two entrances 822. Each of the wide process modules 820 may provide a second process. In one aspect, the second process may be a relatively slow process, such as a plasma enhanced chemical vapor deposition process. By providing processing for multiple workpieces at one time, each wide process module 820 may, even where the second process is relatively slow, balance the capacity of a relatively fast process such as the bevel etch process described above.

A second vacuum chamber 818 may include two or more additional robots and a transfer station 816. The second vacuum chamber 818 may be coupled in a vacuum-sealed engagement to one of the four facets of the first vacuum chamber 806. The two wide process modules 820 may be positioned on opposing sides of the second vacuum chamber, with each of the robots in the second vacuum chamber 818 positioned between an entrance of each of the two wide process modules. The robots may further be positioned to transfer workpieces between one another, permitting greater mobility of workpieces within the vacuum environment of the system 800. The transfer station may be adapted to perform one or more of a heating, a cooling, an aligning, an inspection, a metrology, a testing or a cleaning by the addition of suitable hardware and/or software that is generally known in the art.

In the system 800, workpieces may be transferred among the load lock 804, the two process modules 814, and the two wide process modules 820 in vacuum by the robots of the first vacuum chamber and the second vacuum chamber. The processing speed of the two process modules 814 may be substantially balanced with the processing speed of the two wide process modules 820. It will be understood that the reference to balancing here does not require precise equality of processing time. Rather, balancing as used herein refers to the general notion of providing parallel handling as appropriate to balance the processing speed of fast processes, so that utilization of fast process modules is generally improved. In general, any of the components such as the load lock 804, process modules 814, wide process modules 820, vacuum chambers 806, 818 may be selectively coupled to one another using isolation valves or the like.

A typical process flow for the system 800 may, by way of non-limiting example, include the following steps: (a) preheat workpiece for 20-30 seconds (within load lock, or within a separate preheat station between the load lock and the first vacuum chamber), (b) transfer workpiece to a plasma enhanced chemical vapor deposition (PE-CVD) chamber of one of the wide process modules, (c) process for 60-120 seconds, followed by a clean cycle, (d) transfer workpiece from the PE-CVD chamber to a cool-down location such as the transfer station, (e) cool down 20-30 seconds, (f) transfer to bevel etch process chamber, (g) process workpiece with bevel etch process for 30-60 seconds, (h) return workpiece to load lock. It will be appreciated that more generally steps may be added, omitted, modified, or rearranged, and that a variety of different processes may be performed using one or more of the process modules described above.

FIG. 9 shows a system employing wide process modules to balance processing capacity. In general, the system 900 may be similar to the system 800 described above, with differences noted as follows. The system 900 may include a rear-exit handler 902, which may be coupled through a second load lock 904 to the second vacuum chamber. The rear-exit handler 902 may provide a second exit point for workpieces to and from the vacuum interior of the system 900.

FIG. 10 shows a system employing a hexagonal vacuum chamber to balance processing capacity. In general, the system 1000 may include components such as those described above including for example a number of relatively fast process modules, such as bevel etch process modules coupled to a square vacuum chamber, along with a balanced number of relatively slow process modules, such as PE-CVD process modules. However, rather than provide double wide process modules for increased PE-CVD capacity, the system 1000 shown in FIG. 10 uses a hexagonal vacuum chamber 1002 to provide additional facets so that more PE-CVD modules can be coupled to the vacuum system 1000.

Thus in one embodiment the system 1000 may include four process modules 1004 each having an entrance, and each providing a process such as a PE-CVD process. The vacuum chamber 1002 may have six facets, one of which may be coupled in a vacuum-sealed engagement to the square vacuum chamber, and four of which may be coupled in a vacuum-sealed engagement to the four process modules. The additional facet may be used, for example, for a heating, cooling, or other buffer or transfer station, or to couple to an additional vacuum chamber for additional process modules, or to couple to any other suitable vacuum processing hardware or the like. The vacuum chamber 1002 may also include a robot positioned to transfer workpieces among the six facets, and thus for example among the four process modules 1004 or any other connected hardware.

FIG. 11 shows a system employing a hexagonal vacuum chamber to balance processing capacity. In general, the system 1100 may employ any of the components and arrangements described above. The system may, for example, be similar to the system 1000 of FIG. 10 with the addition of a rear-exit handler 1102, examples of which are also described above.

FIG. 12 shows a system employing two circulating process modules to balance processing capacity. In general, the system 1200 may employ any of the components and arrangements described above including for example a number of relatively fast process modules, such as bevel etch process modules coupled to a square vacuum chamber, along with a balanced number of relatively slow process modules, such as PE-CVD process modules. However, rather than provide double wide process modules or hexagonal vacuum chambers to balance capacity, the system 1200 provides a number of circulating process modules 1202 to balance capacity.

A circulating process module 1202 may permit deposit of a number of workpieces, which may be loaded serially or the like, into a lazy Susan or similar handler or carousel for processing. Although four discrete locations are depicted in FIG. 12 for each circulating process module 1202, it will be understood that more generally any number of locations may be provided, and that movement of the workpieces within the circulating process module 1202 may follow circular motion or movement through some other rectangular or curvilinear path, and may in certain embodiments include vertical movement in a stack or the like. It will also be understood that while "circulating" suggests a repeating cycle of locations within the circulating process module 1202, in certain embodiments, loading and unloading may be performed in forward or reverse order, or the circulating process module 1202 may provide effectively random access to workpiece locations. It will further be understood that one location within the circulating process module 1202, which may be the load or unload location or any other suitable location, may provide cooling or other thermal management, alignment, or the like for workpieces added to and/or removed from the circulating process module. In one embodiment, the circulating process module 1202 provides a capacity for four workpieces including three PE-CVD processing locations, and one cooling location.

FIG. 13 shows a system employing circulating process modules to balance processing capacity. In general, the system 1300 may employ any of the components and arrangements described above. The system may, for example, be similar to the system 1200 of FIG. 12, with the addition of a rear-exit handler 1302, examples of which are also described above. The addition of a rear-exit handler 1302 may support additional workpiece paths through the system 1300, such as a generally left-to-right flow of workpieces through the system 1300 as illustrated in FIG. 13.

Figure 17A:
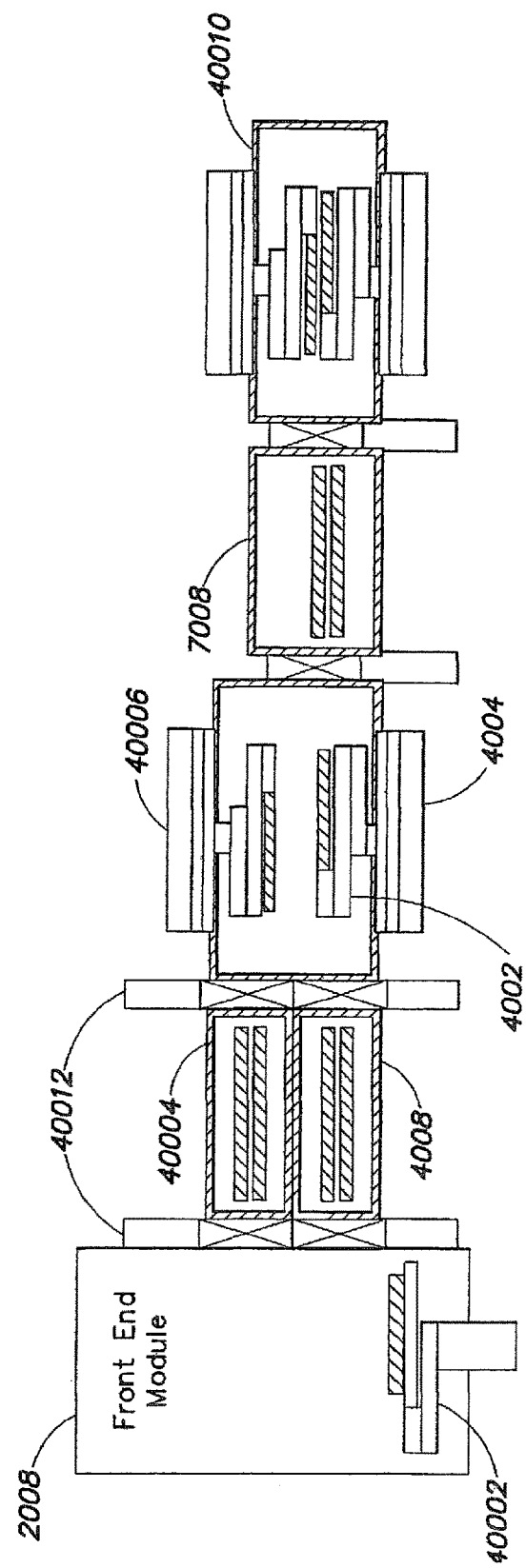
FIG. 17A illustrates a vertically arranged load lock assembly in accordance with embodiments of the invention.

FIG. 17A shows a stacked vacuum load lock 4008, 40004 for entering materials into a vacuum environment. One limiting factor on bringing wafers 31008 into a vacuum system is the speed with which the load lock can be evacuated to high vacuum. If the load lock is pumped too fast, condensation may occur in the air in the load lock chamber, resulting in precipitation of nuclei on the wafer 31008 surfaces, which can result in particles and can cause defects or poor device performance. Cluster tools may employ two load locks side by side, each of which is alternately evacuated. The pumping speed of each load lock can thus be slower, resulting in improved performance of the system. With two load locks 4008 40004 in a vertical stack, the equipment footprint stays very small, but retains the benefit of slower pumping speed. In embodiments, the load lock 40004 can be added as an option. In embodiments the robotic arms 4004 and 40006 can each access either one of the two load locks 4008 40004. In embodiments the remaining handoff module 7008 could be a single level handoff module.

Figure 17B:
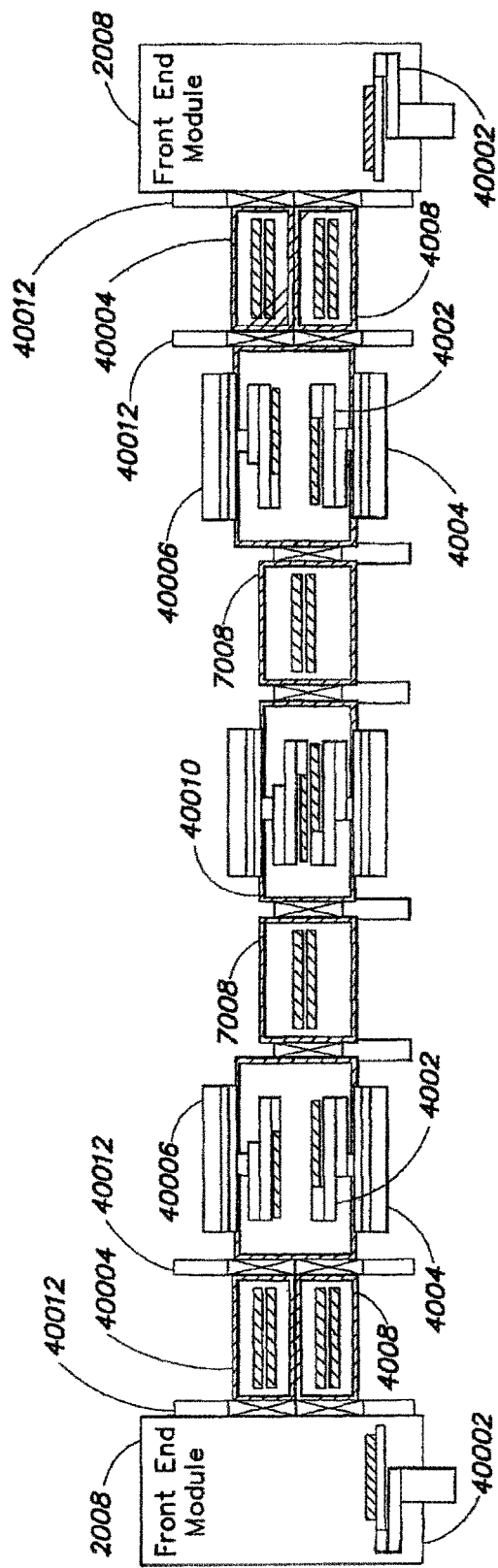
FIG. 17B illustrates a vertically arranged load lock assembly at both sides of a wafer fabrication facility in accordance with embodiments of the invention.

FIG. 17B shows another load lock layout. In this figure wafers 31008 can be entered and can exit at two levels on either side of the system, but follow a shared level in the rest of the system.

Figure 18:
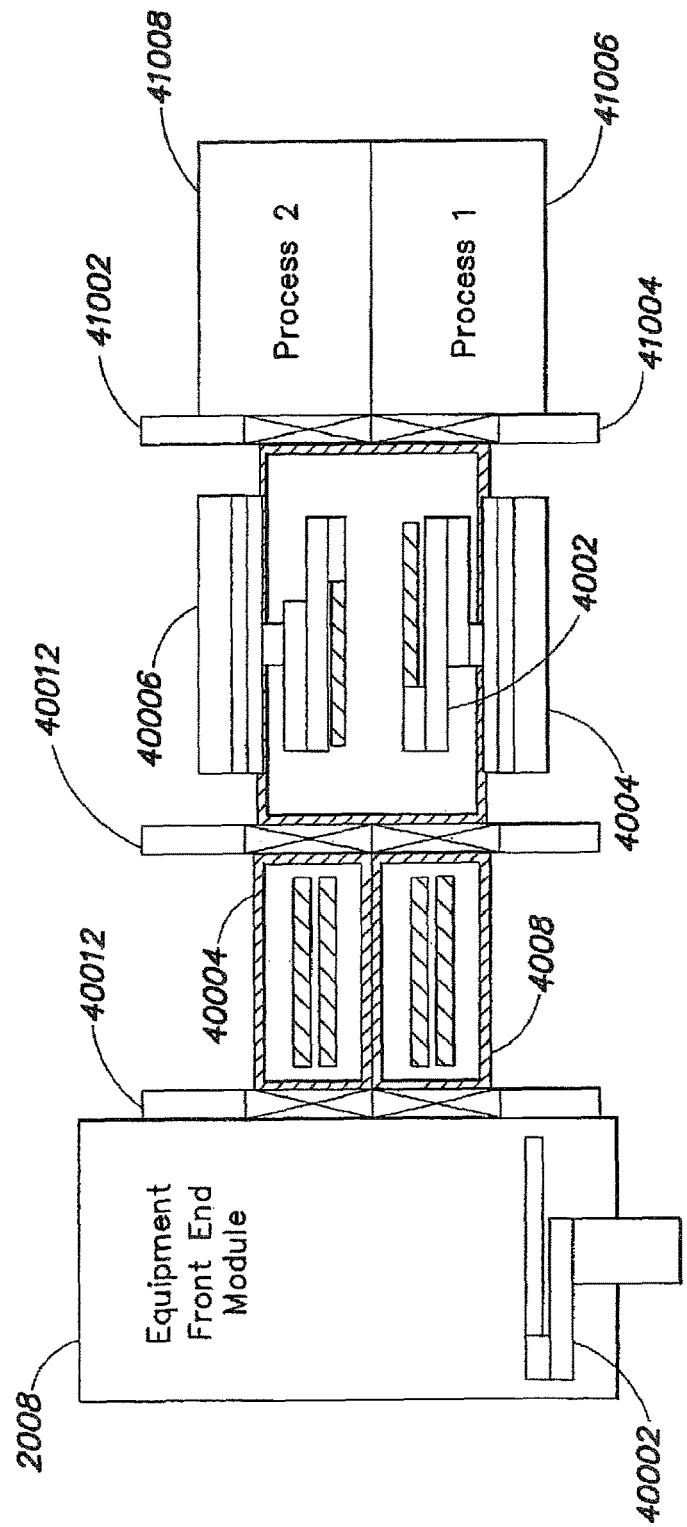
FIG. 18 shows a vertically arranged load lock and vertically stacked process modules in accordance with embodiments of the invention.

FIG. 18 details how the previous concept of stacked load locks 4008 40004 can be also implemented throughout a process by stacking two process modules 41006, 41008. Although such modules would not be compliant with the SEMI standard, such an architecture may offer significant benefits in equipment footprint and throughput.

Figure 19:
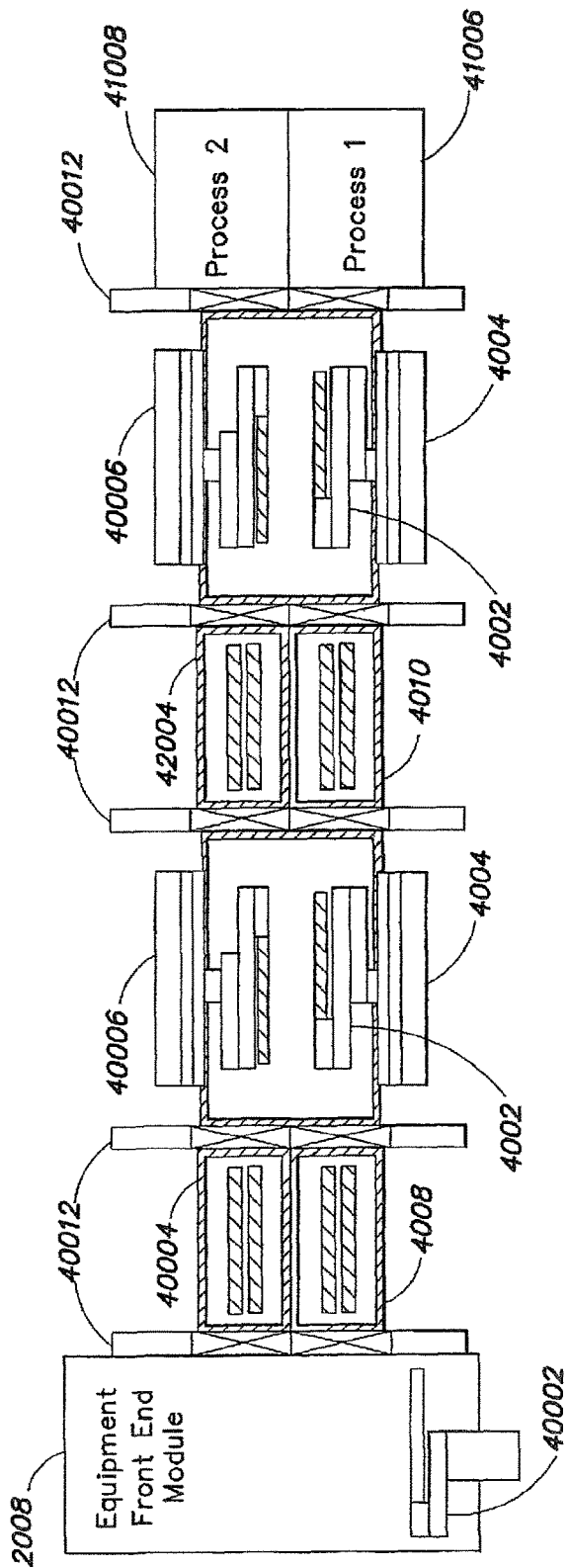
FIG. 19 shows a linearly arranged, two-level handling architecture with vertically stacked process modules in a cross-sectional side view in accordance with embodiments of the invention.

FIG. 19 shows a system with two handling levels 4008, 40004, 4010, 42004: wafers may be independently transported between modules using either the top link 40006 or the bottom link 4004. Optionally, each handling level may have two load locks to provide the advantage of reduced evacuation speed noted above. Thus a system with four input load locks, two handling levels, and optionally four output load locks, is also contemplated by description provided herein, as are systems with additional load lock and handling levels.

Figure 20:
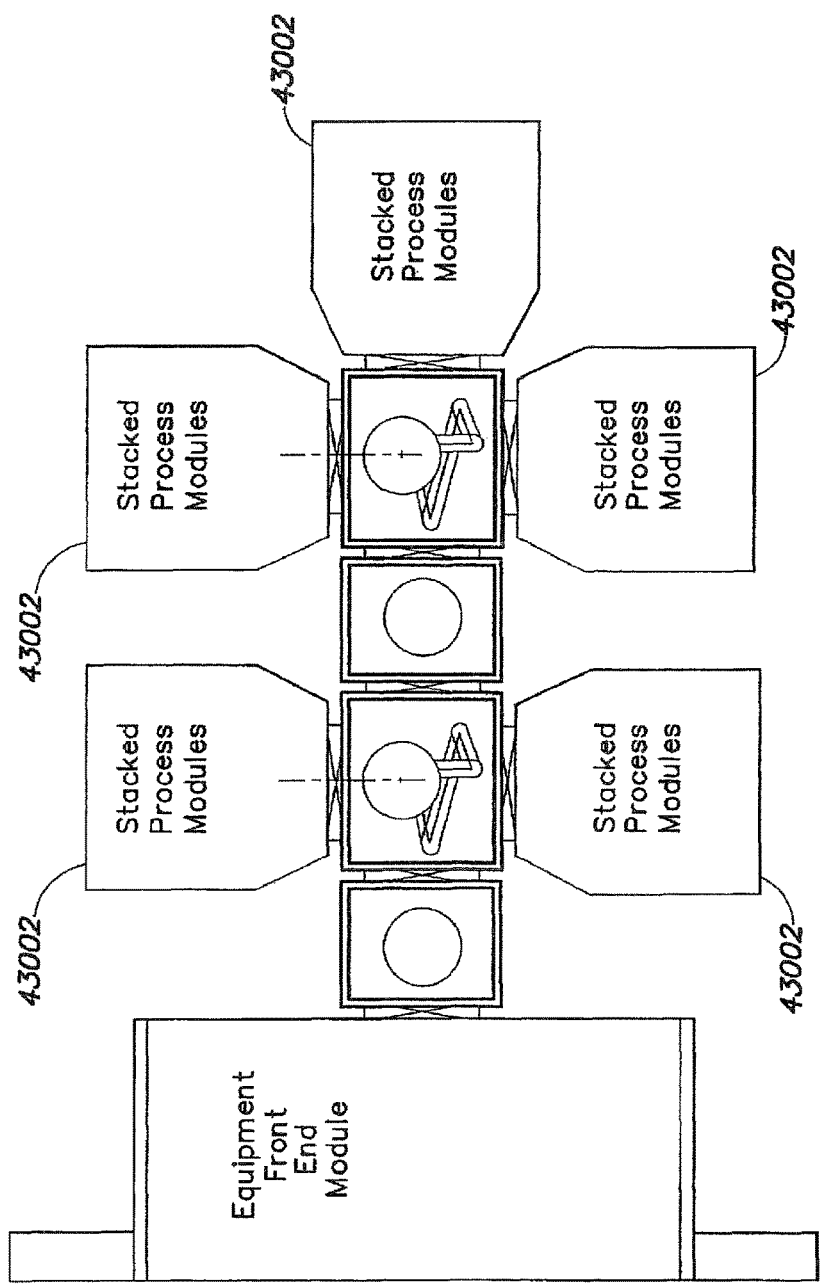
FIG. 20 shows the handling layout of FIG. 19 in a top view.

FIG. 20 shows a top view of the system of FIG. 19.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and the invention is to be interpreted in the broadest sense allowable by law.

What is claimed is:

1. A apparatus comprising:
an equipment front end module that forms an ambient atmospheric portion of the apparatus;
a substantially hexahedron shaped sealed transport chamber that forms, at least in part, a vacuum portion of the apparatus and has four facets of the substantially hexahedron shaped sealed transport chamber connecting a top plane and a bottom plane of the substantially hexahedron shaped sealed transport chamber, each facet having a substrate transport opening configured for sealed communication with substrate holding modules, each transport opening having a sealable valve;
a robotic transport arm disposed within the substantially hexahedron shaped sealed transport chamber, the robotic transport arm having a common substrate holder effecting each substrate transfer of the robotic transfer arm on a common substrate transfer plane through the substrate transport opening on each facet of the four facets of the substantially hexahedron shaped sealed transport chamber;

a load lock connected to a facet of the four facets of the substantially hexahedron shaped sealed transport chamber for connecting the equipment front end module to the substantially hexahedron shaped sealed transport chamber; and a second sealed transport chamber that forms, at least in part, the vacuum portion of the apparatus and has more than four facets and being communicably connected to one other facet of three remaining facets of the four facets of the substantially hexahedron shaped sealed transport chamber through the sealable valve of the other facet of the substantially hexahedron shaped sealed transport chamber, wherein the robotic transport arm is configured to extend through the sealable valve on each facet of the four facets of the substantially hexahedron shaped sealed transport chamber, each facet of the second sealed transport chamber having a substrate transport opening configured for sealed communication with other substrate holding modules.

2. The apparatus of claim 1, wherein the equipment front end module is configured to physically handle substrates in an atmospheric environment.

3. The apparatus of claim 1, wherein the robotic transport arm is configured for transferring substrates to and from the substantially hexahedron shaped sealed transport chamber.

4. The apparatus of claim 3, wherein the robotic transport arm comprises unequal length arm links.

5. The apparatus of claim 4, wherein the robotic transport arm comprises at least three arm links.

6. The apparatus of claim 1, wherein the substantially hexahedron shaped sealed transport chamber and the second sealed transport chamber are configured to hold a vacuum atmosphere.

7. The apparatus of claim 1, wherein the second sealed transport chamber has six facets.

8. The apparatus of claim 1, further comprising a transfer station configured to couple the second sealed transport chamber to the substantially hexahedron shaped sealed transport chamber.

9. The apparatus of claim 8, wherein the transfer station is further configured to perform one or more of a heating, a cooling, an aligning, an inspection, a metrology, a testing, or a cleaning operation on a substrate.

10. The apparatus of claim 1, further comprising a rear exit handler and a second load lock, the second load lock coupling the rear exit handler to the second sealed transport chamber.

11. The apparatus of claim 1, further comprising a controller arranged to cycle a number of sealable valves on the more than four facets of the second sealed transport chamber wherein a number of facets of the second transport chamber have a number of sealable valves on the more than four facets, cycled by the controller based on and effecting a processing capacity of process modules coupled to the second sealed chamber through the number of sealable valves and wherein the number of sealable valves on the more than four facets is such that cycles thereof balance with cycles of all the sealable valves, coupled to the each of the other two facets of the four facets of the substantially hexahedron shaped sealed transport chamber, controlled based on and affecting another process capacity of other process modules coupled to the each of the other two facets of the four facets of the substantially hexahedron shaped sealed transport chamber.

12. An apparatus comprising:
an equipment front end module that forms an ambient atmospheric portion of the apparatus;
a substantially hexahedron shaped sealed transport chamber that forms, at least in part, a vacuum portion of the apparatus and has four facets of the substantially hexahedron shaped sealed transport chamber connecting a top plane and a bottom plane of the substantially hexahedron shaped sealed transport chamber, each facet having a substrate transport opening configured for sealed communication, through a sealable valve, with substrate holding modules;
a load lock connected to a facet of the four facets of the substantially hexahedron shaped sealed transport chamber for connecting the equipment front end module to the substantially hexahedron shaped sealed transport chamber;
a second sealed transport chamber that forms, at least in part, the vacuum portion of the apparatus and has more than four facets and being communicably connected to one of the other three facets of the four facets of the substantially hexahedron shaped sealed transport chamber through a respective sealable valve, each facet of the second sealed transport chamber having a substrate transport opening configured for sealed communication with other substrate holding modules; and
an unequal length arm link compact SCARA robot transfer arm disposed in at least one of the substantially hexahedron shaped sealed transport chamber and the second sealed transport chamber, wherein the unequal length arm link compact SCARA robot transfer arm is configured to extend through the sealable valve between the substantially hexahedron shaped sealed transport chamber and the second sealed transport chamber, the unequal length arm link compact SCARA robot transfer arm has a common substrate holder effecting each substrate transfer of the unequal length arm link compact SCARA robot transfer arm on a common substrate transfer plane through the sealable valve on each facet of the at least one of the substantially hexahedron shaped sealed transport chamber and the second sealed transport chamber and maintains a balanced processing capacity between the substantially hexahedron shaped sealed transport chamber and the second sealed transport chamber with the common substrate holder.

13. The apparatus of claim 12, wherein the equipment front end module is configured to physically handle substrates in an atmospheric environment.

14. The apparatus of claim 12, wherein the unequal length arm link compact SCARA robot transfer arm includes at least three arm links.

15. The apparatus of claim 14, wherein the unequal length arm link compact SCARA robot transfer arm includes four arm links.

16. The apparatus of claim 12, wherein the unequal length arm link compact SCARA robot transfer arm is configured to hold more than one substrate.

17. The apparatus of claim 12, wherein the second sealed transport chamber has six facets.

18. The apparatus of claim 12, further comprising a transfer station configured to couple the second sealed transport chamber to the substantially hexahedron shaped sealed transport chamber.

19. The apparatus of claim 18, wherein the transfer station is further configured to perform one or more of a heating, a cooling, an aligning, an inspection, a metrology, a testing, or a cleaning operation on a substrate.

20. The apparatus of claim 12, further comprising a rear exit handler and a second load lock, the second load lock coupling the rear exit handler to the second sealed transport chamber.

21. The apparatus of claim 12, wherein at least one facet of at least one of the four facets of the substantially hexahedron shaped sealed transport chamber and the second sealed transport chamber includes stacked substrate transport openings.

* * * * *